(12) United States Patent
Keaveney et al.

(10) Patent No.: US 11,435,234 B1
(45) Date of Patent: Sep. 6, 2022

(54) INCREASING THE MEASUREMENT PRECISION OF OPTICAL INSTRUMENTATION USING KALMAN-TYPE FILTERS

(71) Applicant: Quantum Valley Ideas Laboratories, Waterloo (CA)

(72) Inventors: James Keaveney, Waterloo (CA); Geoffrey Gordon Gillett, Waterloo (CA); James P. Shaffer, Kitchener (CA)

(73) Assignee: Quantum Valley Ideas Laboratories, Waterloo, (CA)

( * ) Notice: Subject to any disclaimer, the term of this patent is extended or adjusted under 35 U.S.C. 154(b) by 0 days.

(21) Appl. No.: 17/474,946

(22) Filed: Sep. 14, 2021

Related U.S. Application Data

(60) Provisional application No. 63/147,957, filed on Feb. 10, 2021.

(51) Int. Cl.
   *G01J 9/02* (2006.01)
   *H03H 17/02* (2006.01)
(52) U.S. Cl.
   CPC ....... *G01J 9/0246* (2013.01); *H03H 17/0257* (2013.01); *G05B 2219/41146* (2013.01)
(58) Field of Classification Search
   CPC ...... G01J 9/0246; G01J 2005/583; G01J 9/00; H03H 17/0257; G05B 2219/41146;
   (Continued)

(56) References Cited

U.S. PATENT DOCUMENTS 4,173,442 A   11/1979  Snyder
4,191,473 A    3/1980  Hansch
(Continued)

FOREIGN PATENT DOCUMENTS

CN    108599737 B  *  9/2018  ............. H03H 21/00
CN    111756353 A  * 10/2020  ............. H03H 17/02
(Continued)

OTHER PUBLICATIONS

R. Van Der Merwe, "Sigma-Point Kalman Filters for Probabilistic Inference in Dynamic State-Space Models", Ph. D Thesis, univ. of Stellenbosch (2004).*
(Continued)

*Primary Examiner* — Mohamed K Amara
(74) *Attorney, Agent, or Firm* — Henry Patent Law Firm PLLC

(57) ABSTRACT

In a general aspect, a method is presented for increasing the measurement precision of an optical instrument. The method includes determining, based on optical data and environmental data, a measured value of an optical property measured by the optical instrument. The optical instrument includes an optical path and a sensor configured to measure an environmental parameter. The method also includes determining a predicted value of the optical property based on a model representing time evolution of the optical instrument. The method additionally includes calculating an effective value of the optical property based on the measured value, the predicted value, and a Kalman gain. The Kalman gain is based on respective uncertainties in the measured and predicted values and defines a relative weighting of the measured and predicted values in the effective value.

30 Claims, 19 Drawing Sheets

(58) Field of Classification Search
CPC . G01B 9/0209; G01B 11/2441; H01S 5/0607; H01S 5/0612; H01S 5/06804; G01N 2021/7779; G02F 1/0147; G02F 1/21; G02F 2203/50; G05D 7/00
See application file for complete search history.

(56) References Cited

U.S. PATENT DOCUMENTS

| | | | |
|---|---|---|---|
| 4,847,854 A | 7/1989 | Van Dijk | |
| 5,420,877 A | 5/1995 | Sandstrom | |
| 5,543,916 A | 8/1996 | Kachanov | |
| 6,667,804 B1 | 12/2003 | Kleinschmidt | |
| 7,675,628 B2 | 3/2010 | Millerd et al. | |
| 10,948,356 B1 | 3/2021 | Keaveney et al. | |
| 10,973,483 B2 * | 4/2021 | Koehler | G06T 11/006 |
| 10,989,535 B1 * | 4/2021 | Kim | G02B 6/3546 |
| 2003/0066359 A1 * | 4/2003 | Gysling | G01F 1/74 73/861.23 |
| 2005/0046864 A1 | 3/2005 | Millerd et al. | |
| 2005/0046869 A1 * | 3/2005 | Kawasaki | G01N 25/16 356/519 |
| 2005/0106749 A1 * | 5/2005 | Braig | G01N 21/0303 436/169 |
| 2006/0139656 A1 | 6/2006 | Kulawiec et al. | |
| 2007/0133004 A1 | 6/2007 | Duplain et al. | |
| 2008/0297808 A1 * | 12/2008 | Riza | G01B 9/02072 356/503 |
| 2010/0103403 A1 | 4/2010 | Ishizuka | |
| 2013/0314694 A1 * | 11/2013 | Tchoryk, Jr. | G01N 21/538 356/28.5 |
| 2015/0300952 A1 | 10/2015 | Campball et al. | |
| 2016/0191163 A1 * | 6/2016 | Preston | G01H 9/004 398/16 |
| 2017/0167858 A1 * | 6/2017 | Chen | G01B 11/002 |
| 2017/0357159 A1 | 12/2017 | Kant et al. | |
| 2018/0102627 A1 | 4/2018 | Parker et al. | |
| 2020/0183195 A1 | 6/2020 | Morrison | |

FOREIGN PATENT DOCUMENTS

| | | | | |
|---|---|---|---|---|
| CN | 112268521 A | * | 1/2021 | G01B 11/24 |
| DE | 1114407 | | 11/1992 | |
| EP | 0288602 A2 | * | 11/1988 | H01S 3/139 |
| EP | 2634594 A1 | * | 9/2013 | G01B 9/02 |
| EP | 2762831 A1 | * | 8/2014 | G01B 5/008 |
| JP | 2002140002 | | 5/2002 | |
| KR | 100956215 B1 | * | 5/2010 | G06F 11/34 |
| WO | 2021258184 | | 12/2021 | |

OTHER PUBLICATIONS

WIPO, International Search Report and Written Opinion dated Mar. 18, 2021, in PCT/CA2020/051749, 10 pgs.
USPTO, Non-Final Office Action dated Jul. 28, 2020, in U.S. Appl. No. 16/907,469, 15 pgs.
USPTO, Notice of Allowance dated Nov. 10, 2020, in U.S. Appl. No. 16/907,469, 7 pgs.
Ciddor, "Refractive index of air: new equations for the visible and near infrared", Applied Optics 35, 9, Mar. 20, 1996, 8 pgs.
Gray, et al., "Simple Compact Fizeau Wavemeter", Applied Optics 25, 8, Apr. 15, 1986, 5 pgs.
Hughes, et al., "Measurements and their Uncertainties", Oxford University Press, 2010, 153 pgs.
Julier, et al., "A New Extension of the Kalman Filter to Nonlinear Systems", Defense, Security and Sensing; DOI: 10.1117/12.280797, 1997, 13 pgs.
Kalman, "A New Approach to Linear Filtering and Prediction Problems", Transactions of the ASME-Journal of Basic Engineering, 82 (Series D): 35-45, 1960, 12 pgs.
Labbe, "Kalman and Bayesian Filters in Python", https://github.com/rlabbe/Kalman-and-Bayesian-Filters-in-Python, Release 2.0, Oct. 2020, 10 pgs.
Lefferts, et al., "Kalman Filtering for Spacecraft Attitude Estimation", Journal of Guidance, Control, and Dynamics, Sep.-Oct. 1962, 14 pgs.
Lillacci, et al., "Parameter Estimation and Model Selection in Computational Biology", PLOS Computational Biology, Mar. 5, 2010, 17 pgs.
Louka, et al., "Improvements in wind speed forecasts for wind power prediction purposes using Kalman filtering", Journal of Wind Engineering and Industrial Aerodynamics, Dec. 2008, 42 pgs.
Wan, et al., "The Unscented Kalman Filter for Nonlinear Estimation", Adaptive Systems for Signal Processing, Communications, and Control Symposium 2000, Feb. 2000, 7 pgs.
WIPO, International Search Report and Written Opinion dated Apr. 26, 2022, in PCT/CA2022/050139, 10 pgs.
Herring, et al., "Geodesy by Radio Interferometry: The Application of Kalman Filtering to the Analysis of Very Long Baseline Interferometry Data", Journal of Geophysical Research, Aug. 10, 1990, 21 pgs.
Ramachandrea, "Kalman Filtering Techniques for Radar Tracking", Marcel Dekker, Inc., 2000.
Zihajehzadeh, et al., "A cascaded Kalman filter-based GPS/MEMS-IMU integration for sports applications", Measurement 73, May 25, 2015, 3 pgs.

* cited by examiner

INCREASING THE MEASUREMENT PRECISION OF OPTICAL INSTRUMENTATION USING KALMAN-TYPE FILTERS

CROSS-REFERENCE TO RELATED APPLICATIONS

This application claims priority to U.S. Prov. App. No. 63/147,957, which was filed on Feb. 10, 2021 and entitled, "Increasing the Measurement Precision of Optical Instrumentation using Kalman-Type Filters." The disclosure of the priority application is hereby incorporated by reference herein in its entirety.

BACKGROUND

The following description relates to increasing the measurement precision of optical instrumentation using Kalman-type filters.

Lasers can be precise tools for manipulating matter and making interferometric measurements. In some cases, the lasers are precisely tuned to atomic resonances to allow them to be used in commercial applications. Examples of such applications include clocks, gravitometers, electric and magnetic field sensors, and accelerometers. These applications rely upon accurate, precise, and stable instrumentation in order to measure, tune, and control the laser systems to the level required. High precision devices and instrumentation are inherently sensitive to external, environmental changes.

DETAILED DESCRIPTION

Figure 1A:
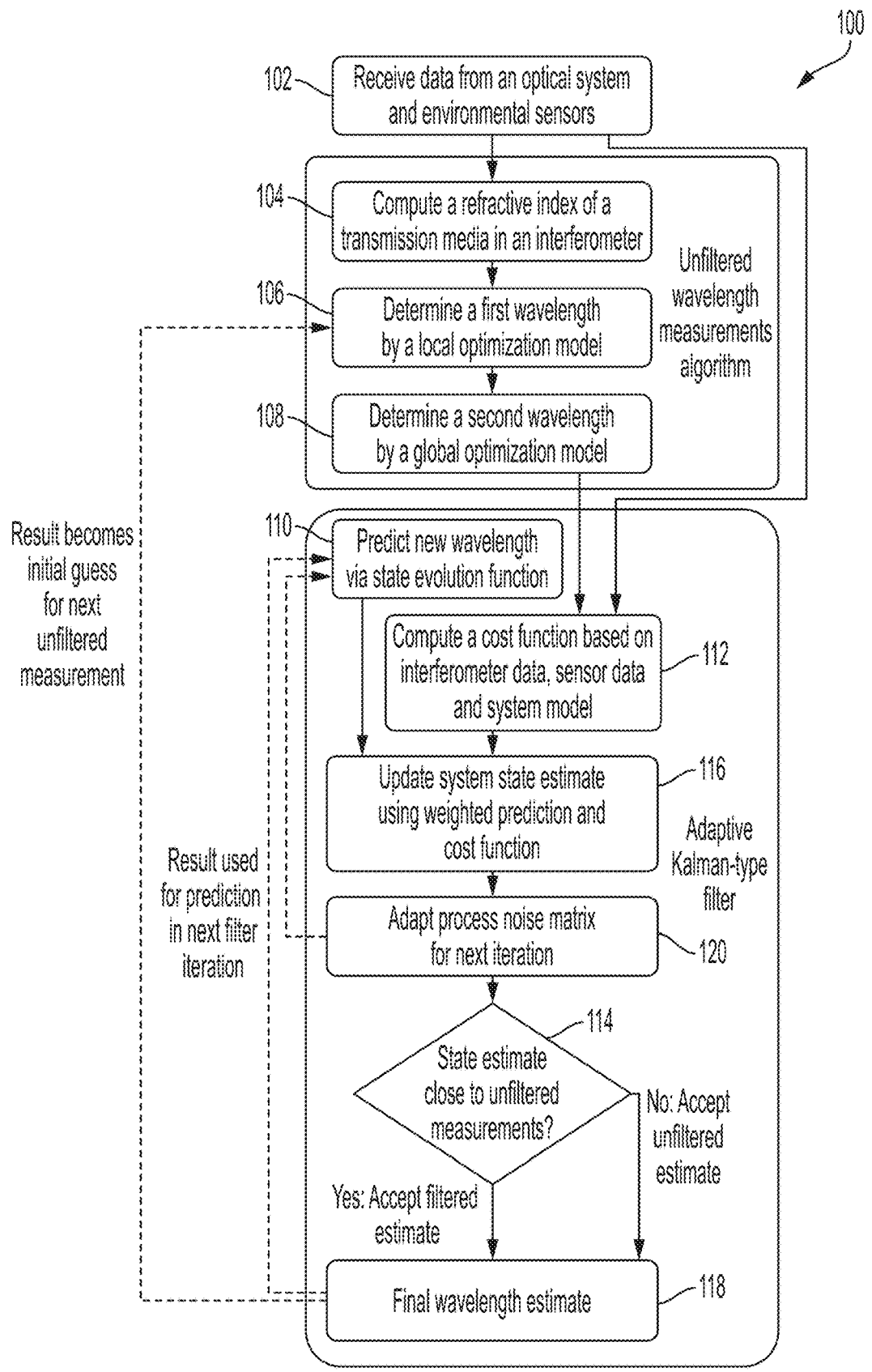
FIG. 1A is a flowchart of an example method for increasing the measurement precision of a wavelength measurement system using a Kalman-type filter.

In a general aspect, this disclosure describes the improvement of measurement precision in optical instruments, especially those that are sensitive to environmental fluctuations. The improvement may result from the implementation of a Kalman-type filter, and the optical instruments may be electronic, mechanical, or optical in nature (or some combination thereof). Rather than controlling the environment, a sensor or array of sensors may be used to track the environment and correct a measurement based on a model of how the environment affects the result in real-time. Using a Kalman-type filter that combines sensor data with a process model of how the environment couples to the instrument measurement, environmental fluctuations can be compensated for and the measurement noise reduced, resulting in an increase of the measurement precision. Examples of Kalman-type filters include a Kalman Filter or one of its many variants such as the extended Kalman filter (EKF) or unscented Kalman filter (UKF).

An example of a possible application involves an optical wavelength meter where the environment is strongly coupled to the meter's performance through the refractive index of the optical transmission medium. The refractive index of the optical transmission medium may depend on the medium temperature, pressure, humidity, and gas composition. The measurement precision of the optical wavelength meter may be increased by active monitoring of the temperature, atmospheric pressure, $CO_2$ concentration, and relative humidity of the optical transmission medium inside the wavelength meter. This active monitoring can dramatically reduce the long-term drift of the measured optical frequency. However, by adding a Kalman-type filter to the signal processing chain, noise in the sensor measurements and instrument output—e.g. the optical wavelength in the case of the wavelength meter—may be suppressed.

Unlike certain other post-processing smoothing or filtering techniques, the Kalman-type filter described herein can operate in real-time to filter incoming, unknown data, with little processing overhead. The Kalman-type filter can be added to an existing system at the software level, so a direct comparison can be made of the system performance with and without the filter. An example of the effectiveness of the Kalman-type filter with a wavelength meter can be seen in FIGS. 2A & 2B, where the short-term wavelength precision (as indicated by the Allan deviation) is around 50 kHz, or about 1.4 parts in $10^{10}$. This increase in measurement precision represents an improvement of an order of magnitude over the case where the filter is not operating. Moreover, the filter has not been found to induce any adverse effects on the long-term measurement stability of the optical wavelength meter.

In many implementations, the Kalman-type filters may be used in conjunction with optical signals generated by lasers. Lasers have become precise tools for manipulating matter and making interferometric measurements. In many cases, the lasers are precisely tuned to atomic resonances to successfully use them for commercial applications. For example, the lasers may be used in devices such as clocks, gravitometers, electric and magnetic field sensors, and accelerometers. These applications rely upon accurate, precise, and stable optical instrumentation to measure, tune, and control the lasers to the level required. However, high precision optical instrumentation may be inherently sensitive to external, environmental changes. In some cases, this sensitivity may make the placement of such instrumentation in the field challenging. If the changes induced by the environment are not compensated for, they can cause unacceptable drift and a resulting loss of accuracy in a measurement or process.

Strategies may be used to mitigate the effect of the external environment while retaining the measurement accuracy. For example, one may attempt to isolate an optical instrument from its environment. As another example, one may attempt to actively control the environment around the optical instrument. One may also monitor the environment through sensors and incorporate the environment's properties into the instrument measurement, compensating for any drift in the environment through a suitable model of the system. The first two strategies, however, may not improve the performance of an optical instrument to levels needed for certain applications, even when combined. The development of inexpensive, accurate environmental sensors, however, not only allows the third strategy to be implemented, but also may allow field deployment where the reduction in size, weight, power consumption, and cost (SWaP-C) is advantageous.

For fieldable instrumentation, lowering SWaP-C while preserving the measurement performance confers a notable commercial advantage. In this case, the first two strategies for mitigating the effect of the environment on a measurement often bring disadvantages. For example, isolating the environment may require adding extra insulating features, usually adding to the size and weight of the device. Controlling the environment, especially the temperature, often consumes prohibitive amounts of power, and adds complexity to the mechanical design of the optical instrument. A better, alternative strategy is to model the environmental effect on the measurement (e.g., through a model of the optical instrument) and determine the state of the environment using low power, low-cost sensors. This strategy allows the optical instrument to correct the measurement data for the state of the environment. Such correction moves improving the optical instrument's performance into the software domain, where a suitable system model can be developed to understand how the environment couples to the measurement system. For example, thermal expansion of components, or changes to the optical transmission medium can be modeled as a function of their environment and shifts in their values that affect the measurement of the target quantity corrected for in software. In certain cases, the model for how the measurement is affected by the environment need not be complex because many of the induced changes may be linear.

Once a model has been developed, environmental sensor measurements can be fed forward to the system where the instrument measurement takes this data into account. Although sensors continue to be developed with ever-better signal-to-noise ratios, there is typically some inherent noise present in a sensor measurement. As such, the sensor measurements can be represented in the context of a 'true' value plus noise. By including sensor measurements in the instrument to correct environmental drift, noise can be passed to the final, target measurement, reducing its effective precision. The noise in the sensor measurements determines how well the state of the environment is known, thus determining how precisely a measurement done by the instrument can be corrected.

In some implementations, methods for increasing the measurement precision of an optical instrument may suppress environmental sensor noise and increase the instrument measurement precision (e.g., relative to using the raw sensor data alone). The methods are generally applicable to a range of optical devices and instrumentation, such as a wavelength meter or interferometer.

For example, the wavelength meter may correspond to a fieldable optical instrument that has minimal long-term drift in its wavelength measurement. The fieldable optical instrument may include an interferometer (e.g., a Fizeau interferometer) and a control system. The minimal long-term drift results from combining, via operation of the control system, interferometric data with data from low-cost, low-power environmental sensors. A mathematical model is used by the control system to determine the refractive index of the optical transmission medium inside the interferometer, thereby correcting a major source of long-term drift. This approach allows the wavelength meter to mitigate (or eliminate) the long-term drift in wavelength measurements to a level where the meter can be configured in compact, fieldable form. In this configuration, the wavelength meter can out-perform commercial wavelength meters designed for controlled laboratory environments. While the long-term performance of the wavelength meter can be better than current commercial systems, short-term precision can be limited by shot-to-shot noise in the interferograms as well as noise in the environmental sensor measurements.

To improve the short-term performance, a Kalman-type filter may be added to the software operations executed by the control system. As used herein, the term "Kalman-type filter" refers to the original Kalman filter and any member of the family of filters that have been developed therefrom, including the Extended Kalman Filter, the Unscented Kalman Filter, and others. These different filters are commonly optimized for different applications, depending on the non-linearity of the system they are applied to, but share a common set of operating principles. In particular, they are based on a predict-and-update iterative model, where a prediction of the sensor/measurement value based on some evolution model is combined with new (or unfiltered) measurement data. The data and prediction are weighted based on the past history of the data, and a new estimate of the system state is formed based on this weighting. The filter output (e.g., the state estimate) therefore reduces the effect of noisy incoming data. If the prediction is accurate then the new data should lie close to the prediction and the measurement is likely to be more heavily weighted. If the data is far from the prediction, then it is likely to be due to noise and is therefore less heavily weighted.

In many implementations, the optical instruments described herein combine interferometric data with environmental data from the environmental sensors (e.g., sensors measuring temperature, pressure, humidity, etc.). The interferometric data may allow the determination of a measured frequency (or wavelength) of an optical signal, such as that produced by a laser. The Kalman-type filter is applied to the environmental data and optical frequency data, and the reduced-noise output from the filter is the new optical frequency measurement. The short-term measurement precision of the optical instruments may be increased significantly relative to operation without the Kalman-type filter. Moreover, this increase may occur without affecting long-term stability. For example, as will be described in relation to FIGS. 2A and 2B, the short-term measurement precision of an optical instrument may be improved by about 20 times while retaining the long-term stability of the optical instrument.

Many newly developing quantum technologies rely on optical instruments where optical signals form an integral part of a measurement and/or detection process. As these technologies transition from laboratory environments to self-contained, packaged instruments, a sizeable challenge lies in the integration of diagnostic optical instrumentation (e.g., wavelength meters, interferometers, and other active optical components). By their nature, such instruments are sensitive to the external environment in which they operate. Many of these instruments have been, up to this point, only available in benchtop configurations and come with a significant level of SWaP-C.

For integration purposes, it is desirable that the absolute accuracy and precision of a benchtop instrument be preserved (if not increased) all while reducing physical size and power consumption. This criterion can be extremely difficult to achieve using the active, physical feedback approaches common to benchtop instruments that aim for precise control of the environment where the instrument is used. To realize a stable measurement using active feedback, the instrument is often first passively isolated. Active control methods, consisting of transducers, sensors, and feedback algorithms are then designed and utilized to respond to environmental changes in a wide range of situations where the overall apparatus is meant to function. Because of the thermal mass of the benchtop instrument, temperature control, for example, can be challenging to implement and may require large amounts of power.

To reduce sensitivity to environmental variations, conventional optical instruments have either fully-isolated the optical components (e.g., placed their optical components in a fixed background gas or in vacuum) and/or actively stabilized the environment using feedback control of temperature and pressure (e.g., used a controlled pure $N_2$ atmosphere). However, even with active feedback and/or isolation, a small amount of long-term drift is still present in these instruments. Moreover, both approaches, isolation and active control, become cost, power, and/or size prohibitive when considering miniaturization and integration into photonic instrumentation.

In some cases, a solution to these problems is to correct for the environmental disturbance—e.g., correct for air pressure, air temperature, relative humidity, $CO_2$ concentration, and so forth—in a way that maintains the instrument's accuracy over the long-term. By measuring the environmental quantities in close proximity to the most sensitive components (e.g., an interferometer) and using an accurate model of the coupling between the environmental parameter(s) to the final instrument measurement, such as the index of refraction of the transmission medium inside an interferometer, accurate measurements can be made while reducing power consumption and cost. Advances in sensor technology and computing power enable such solutions to surpass environmental stabilization and isolation strategies in accuracy and practicality.

Despite improvements to sensor technology, the output from any sensor, neglecting systematic deviations, will reflect the true value of the measured property plus noise. Modeling the system with environmental sensors can directly couple noise in the sensor measurements to a final measurement by the instrument (e.g., a frequency or wavelength measurement in the case of a wavelength meter, or the cavity resonance frequency in the case of a Fabry-Perot interferometer). While the sensor and measurement noise averages to zero in the long-term, the short-term measurement becomes less precise, but more accurate, than it would have been without the sensor feed-forward. Optical instruments with high relative precision—less than approx. 1 part in $10^8$—are highly desirable, and as such, the sensor noise needs to be of a similar relative level so as to not impact the final instrument measurement.

In addition to the environmental sensor noise, there may also be unavoidable shot-to-shot variation in the optical input data (e.g., the interferograms in the case of a wavelength meter) that causes short-term fluctuation in the measurement. Even if the optical instrument is known to be stable to a higher precision, such as in an interferometric measurement with a frequency-locked laser, the measurement will exhibit less precision because of the shot-to-shot noise. Addressing these sources of noise is not a trivial task. For example, one cannot simply average together results because time resolution will be lost, which can be particularly important when the measurement of the optical instrument is used as a feedback element for some other part of the larger system, e.g., where an interferometer is used to control the laser frequency in an atomic clock. It can be useful to employ a real-time approach to signal processing that has minimal impact to the measurement rate of the instrument, while taking into account noisy data sources.

To address these problems, a member of the family of Kalman-type filters may be used. For example, the Unscented Kalman filter may be used, or other members of the Kalman filter family would also be applicable for the task. Kalman-type filters may be implemented as a signal processing tool that uses a weighted combination of measurement data and a process model to predict the true system state. The Kalman-type filters rely on some knowledge of the system evolution, e.g., the optical instrument evolution, which can be informed by the past measurement history and/or some physical model of the system dynamics to predict a future state of the system. When the system is updated, such as when new data arrives, the predicted state is compared with the next set of noisy measurement data, and then the prediction and measurement are weighted to estimate the true system state. The weighting depends on the relative confidence in each of the prediction and measurement, such as represented by their error bars. For example, if the error on the measurement is small compared to the error on the prediction, the measurement is more heavily weighted, and vice-versa. When a Kalman-type filter is designed properly, continued application of this predict-update loop may result in a real-time smoothing of the system estimate compared with the noisy data.

Kalman-type filters have many advantages that make them suitable for increasing the measurement precision of an optical instrument. For example, Kalman-type filters can work in real-time, as opposed to being applied to a complete data set in post-processing. Kalman-type filters can also combine data from many different sources, even when multiple sensors sensing the same parameter are utilized, e.g., multiple different, independent temperature sensors are used in the optical instrument, including the case of sensor fusion. Moreover, Kalman-type filters can operate with low processing overhead, which means they may have little impact on the total data processing time, so the measurement rate is not significantly affected.

Optical systems are often more complicated to model than kinematic systems (e.g., for navigation and directional sensing), because optical systems depend on the environment in a non-linear and non-trivial manner. One example is the resonant frequency, or frequencies, of a Fabry-Perot interferometer, which is dependent on the interferometer length. The length may be influenced by the generally non-linear thermal expansion of the construction material, typically a low-expansion glass. The temperature of the Fabry-Perot interferometer is strongly influenced by its environment. Even after isolating the Fabry-Perot interferometer inside a high vacuum system, the external environment couples through radiative heating, which itself is non-linear and depends on many system parameters, such as interferometer mass, heat capacity, specific geometry, and so on. When using Kalman-type filters with optical instrumentation, such as the Fabry-Perot interferometer, the optical instrumentation is tracked through an environmental phase space more accurately by using a predictive model, comparing it to measurements, and weighting the predictive model and measurements to yield a more accurate phase space state.

The Kalman-type filters described herein may be adapted to many optical instruments, such as a wavelength meter and an interferometer. Examples of the interferometer include a Fabry-Perot interferometer, a Fizeau interferometer, a Michelson interferometer, and a Mach-Zehnder interferometer. In some implementations, Kalman-type filters are represented by programs that, during operation of the optical instrument, may be executed by a control system. The control system may include a processor, a memory, and a communication interface to facilitate execution of the programs. In some cases, to enhance performance, the optical instrument may include environmental sensors with different properties, e.g., a temperature sensor for measuring the temperature of an optical transmission medium, a pressure sensor for measuring the pressure of the optical transmission medium, and so forth. Where there are compromises in sensor choice, such as a trade-off between absolute accuracy and precision or time response, sensor fusion techniques can be utilized within the Kalman-type filter to combine the advantages of the various sensors. For example, the optical instrument may include a temperature sensor. The temperature sensor may be a solid-state diode sensor with good absolute accuracy after calibration but relatively limited precision (e.g., 10 mK). Thermistors may have much better relative precision (e.g., typically less than 1 mK) but poor absolute accuracy. Combining the solid-state diode sensor with a thermistor would therefore be advantageous so long as the Kalman-type filter was suitably designed to take their relative advantages into account. 'Fusing' two sensors with disadvantageous limitations could then yield a better overall temperature sensor.

In some implementations, the optical instrument may be a wavelength meter that includes a housing and a dual Fizeau interferometer. An example of the wavelength meter is described further in relation to FIGS. 4-5. The sensors of the wavelength meter may monitor the environmental conditions—e.g., air temperature, pressure, and relative humidity ($T_{air}$, P, RH)—inside the housing in close proximity to the dual Fizeau interferometer. In many variations, the sensors monitor the environmental conditions of an optical transmission medium between two reflective surfaces. The interferometer cavity may be open to the air, and as such, the optical transmission medium may be air. The housing may be closed off to prevent dust accumulation but not hermetically sealed. Environmental sensor measurements can be passed to the wavelength fitting algorithm, which uses the refractive index of air corresponding to the measured parameters to calculate the wavelength of an optical signal—such as produced by a laser—using interferograms obtained with the two Fizeau interferometers.

FIG. 1A presents a flowchart of an example method 100 for increasing the measurement precision of a wavelength measurement system using a Kalman-type filter. The wavelength measurement system may be analogous to the example wavelength measurement system 400 described in relation to FIG. 4, and the Kalman-type filter may be an unscented Kalman filter (UKF). In the example method 100, the first operation, represented by block 102 comprises getting new data from the interferometers and sensors. The second, third, and fourth operations—represented by blocks 104-108—are described in further detail in relation to the example processes 800, 900 described in relation to FIGS. 8 and 9.

The example method 100 may utilize a 5-dimensional state space for the Kalman-type filter. For example, the state vector may be represented by Equation (1):

$$x=(x_0 x_1 x_2 x_3 x_4)^T \qquad (1)$$

where the superscript T represents the matrix transpose. The elements 0-4 of the vector represent the temperature T, pressure P, relative humidity RH, optical frequency $f$ and the time derivative of the optical frequency $\dot{f}=df/dt$, respectively. The state vector may be initialized with a measurement using the unfiltered algorithm, and $\dot{f}$ is initialized to 0.

In some implementations, the example method 100 includes a prediction operation, as shown by block 110. The prediction operation 110 may, in some cases, use a state evolution matrix, F, given by Equation (2):

$$F(\Delta t) = \begin{pmatrix} 1 & 0 & 0 & 0 & 0 \\ 0 & 1 & 0 & 0 & 0 \\ 0 & 0 & 1 & 0 & 0 \\ 0 & 0 & 0 & 1 & \Delta t \\ 0 & 0 & 0 & 0 & 1 \end{pmatrix} \qquad (2)$$

The prediction operation 110 may apply F to the state vector via $x_{t+\Delta t}=F(\Delta t) \cdot x_t$. In a linear Kalman-type filter, the prediction operation 110 generates the new state prediction for the next filter iteration. The principle of predictive state evolution is common across all Kalman-type filters, and a prediction of the future state is calculated based on the current state.

In some variations, such as when the Kalman-type filter corresponds to the unscented Kalman filter, the evolution $F(\Delta t) \cdot x_t$ is replaced with a non-linear function $f(x_t, \Delta t)$. However, in this variation, the evolution function can still be linear and can still be represented in matrix form, e.g., $f(x_t, \Delta t)=F(\Delta t) \cdot x_t$. For the unscented Kalman filter, state evolution may utilize a set of test coordinates called sigma points denoted by σ. The sigma points are a set of 2L+1 states of the system, where L is the dimensionality of the state vector (e.g., 5 in the state vector presented above). The set of 2L+1 states are displaced from the previous value of the state in each dimension, e.g., $x_t \pm \pm x_j$ where j=0-4, and are used with a weighting factor to calculate the weighted mean of a non-linear distribution. In variations where the example method 100 includes an unscented Kalman filter, the example method 100 may calculate the state evolution according to Equations (3) and (4):

$$\chi_i = f(\sigma_i, \Delta t) \qquad (3)$$

$$x_{t+\Delta t} = \Sigma_i w_i \chi_i \qquad (4)$$

where $w_i$ is the weighting factor associated with each sigma point $\sigma_i$, and each sigma point is derived from the state at time t. The sigma points propagated through the nonlinear model allow the uncertainties in the state variables to be translated into their effect on the instrumental measurement. For example, temperature variations may have a much larger effect on the instrumental measurement than relative humidity because of the nonlinearity of the model. Quantifying these differences plays a role in implementing the unscented Kalman filter. The sigma points are needed to generate the covariance matrix.

In some implementations, the example method 100 includes determining a covariance matrix $\mathcal{P}$ that represents the uncertainty in the state prediction. The diagonal elements of $\mathcal{P}$ represent uncertainty (e.g., the variance) in each of the state dimensions, while the off-diagonal elements represent the degree of correlation between the dimensions (e.g., the covariance). The covariance matrix may be updated during the prediction operation 110 using the state evolution matrix, F. As the system evolves over several iterations, the confidence in the system model may also evolve. In some variations, the covariance matrix is initialized to values that are significantly larger than the final expected uncertainty in the system, e.g., to reflect the initial lack of knowledge of the system. In these variations, and especially if the Kalman-type filter is properly designed, the covariance matrix will converge from its initial value quickly to one that is representative of the real uncertainty in the system parameters.

In some implementations, the example method 100 also includes determining a process noise matrix $\mathcal{Q}$ that reflects additional uncertainty in the system model. The additional uncertainty may be due to several reasons, including an incomplete system model of the optical instrument where one or more parameters (e.g., time derivatives) are not taken into account; additional uncertainty due to non-Gaussian noise terms in the real system; or other places where the model does not account for the physical system in some way. The process noise matrix $\mathcal{Q}$ may be added as a constant offset to the covariance matrix $\mathcal{P}$ when it is updated. The process noise matrix $\mathcal{Q}$ may be selected to have a predetermined magnitude. For example, if the process noise matrix is too small, the Kalman-type filter may ignore real, unmodeled changes in the optical instrument. If the process noise matrix is too large, the performance of Kalman-type filter will be sub-optimal because the noisy measurement data will be too heavily weighted.

In many implementations, optical and sensor data obtained from the optical instrument (or system) are used to compute a measurement vector z. The optical data may correspond to interferometric data, such as described in relation to FIGS. 7A-7B. The measurement vector z represents the state of the optical instrument (or system) according to the actual sensor data taken at some time instance. The measurement vector z has a different domain and, in general, a different dimensionality than the state vector x. In some cases, the dimensions of the measurement vector are [T, P, RH, $f$, $\chi^2$]. The final term, $\chi^2$, is the result of a cost function C(T, P, RH, $f$) that represents the goodness-of-fit between the input interferometer data and the physical model of the system evaluated at the parameters T, P, RH, and $f$. The cost function is the means by which interferometer data, which is actually an array of many data points, is included in the filter. As indicated by block 112 of FIG. 1A, the cost function may be computed based on the interferometric data, the sensor data, and a model of the optical instrument or system.

In some implementations, the example method 100 also includes determining a measurement noise matrix, $\mathcal{R}$, that reflects the uncertainty in the measurement data. The measurement noise matrix, $\mathcal{R}$, can be determined empirically from the sensor properties. This matrix may set the confidence level, or weighting, of a particular measurement. The diagonal elements in the measurement noise matrix may correspond to the error bars on each of the measured parameters, while the off-diagonal terms indicate the degree of correlation between those parameters.

The filter prediction, in the domain of x, and the measurement, in the different domain of z, need to be compared to create the new estimate (or final wavelength estimate), as shown by interrogatory 114. The new estimate may serve as an effective wavelength measured by the optical instrument. To allow comparison, the domain of x and the domain of z should occupy the same domain. In some variations, a measurement function is used to convert the state domain into the measurement domain. For example, in certain Kalman-type filter implementations, the conversion is a matrix operation, H·x. However, for the unscented Kalman filter, the measurement function is a non-linear function h(x, ID) where ID represents the optical data from the interferometers. This measurement function may be suitable for a wavelength meter, such as the example wavelength measurement system 500 described in relation to FIGS. 5A-5B and the prototype system 600 described in relation to FIG. 6. The function h(x, ID) converts an input state into measurement space, as shown by Equation (5):

$$h(x, \text{ID}) = [x_0, x_1, x_2, x_3, C(x_0, x_1, x_2, x_3)]^T \quad (5)$$

A residual, y, is calculated between the measurement and prediction after the prediction is converted to the measurement domain. In a similar way to the state evolution, sigma points are used for the conversion in the unscented Kalman filter, which is a weighted average over all the sigma points, as shown by Equations (6) and (7)

$$\mathcal{Z}_i = h(\chi_i, \text{ID}) \quad (6)$$

$$\mu_z = \Sigma_i w_i \mathcal{Z}_i \quad (7)$$

Further details of the sigma points are described below in relation to Equations (10)-(26). The residual is then calculated using Equation (8):

$$y = z - \mu_z \quad (8)$$

In many implementations, comparing the state vector x and the measurement vector z includes calculating a Kalman gain K. The Kalman gain K, which may be a matrix, is computed based on the relative confidence in the state prediction, which is related to the covariance matrix $\mathcal{P}$, and the relative confidence in the measurement, which is related to the measurement noise matrix $\mathcal{R}$. The state estimate is then updated according to Equation (9):

$$x_{estimate} = x_{prediction} + K \cdot y. \quad (9)$$

This operation is represented by block 116 in FIG. 1A. If the Kalman gain is high the measurement (z) is favored, whereas if the Kalman gain is low then the model (x) is more heavily weighted. The Kalman gain may allow the example method 100 to generate a final estimate of the wavelength (or frequency), as shown by block 118. The final estimate of the wavelength (or frequency) may serve as an effective wavelength (or frequency) measured by the optical instrument.

After the new estimate has been computed, the process noise matrix is adapted based on how close the estimate of the optical frequency is to the unfiltered measurement. This operation is represented by block 120 in FIG. 1A. Adapting the process noise matrix changes the relative confidence in the prediction on the next iteration of the filter, i.e., it influences the Kalman gain term. As such, the process noise matrix may provide a means to differentiate between different operating modes of the laser being measured.

In some implementations, Kalman-type filters presume the presence of noise that is Gaussian in nature (e.g., white noise). In these implementations, the mathematics underlying the Kalman-type filters may be based on Gaussian functions. Because of the properties of Gaussian functions, the propagation of noise terms (e.g., the process noise, measurement noise, and covariance matrices, etc.) through a linear system results in a Gaussian-distributed output. For the case of a linear system, it is relatively straightforward to calculate a mean and (co)variance. Moreover, the propagation and combination of noise terms allows the Kalman-type filter to be able to correctly weight the model and data. Each new time instance of the Kalman-type filter requires a new state estimate and (co)variance. However, a nonlinear system may require a different approach to determine these quantities.

For example, the unscented Kalman filter allows implementations of the Kalman-type filter to be used with non-linear systems. As described above in relation to Equations (3) and (4), the unscented Kalman filter may replace the linear algebra terms for the state evolution (F) and the measurement (H) matrices with equivalent functions $f(\ldots)$ and $h(\ldots)$, which are more generally applicable to non-linear problems. Propagating Gaussian-distributed inputs through non-linear systems does not, in general, produce a Gaussian-distributed output. However, the use of sigma points ($a_1$) may allow the calculation of a mean and a covariance for the resulting output distributions.

In implementations using sigma points, the input distribution, defined by the state vector (x) and covariance matrix ($\mathcal{P}$), may be sampled at a number of points, with a weighting factor that represents the likelihood of that sample. These sigma points are passed through the non-linear evolution function and allow the mean and covariance of the transformed points to be calculated. In some cases, the sigma points can be efficiently and programmatically selected using the method described below. The method may allow for a reliable estimate of the mean and variance to be calculated with as few input points as possible.

In some variations, the method relies on 2L+1 sigma points, where L is the dimension of the state vector x and is parameterized by $0 \leq \alpha \leq 1$, $\beta \geq 0$, and $\kappa \geq 0$. The points may be selected according to Equation (10):

$$\sigma_i = x_t + \alpha(\eta_i - x_t) \tag{10}$$

In Equation (10), $x_t$ is the state estimate at time t and $\eta_i$ may be determined according to the following equations:

$$\eta_0 = x_t \tag{11}$$

$$\eta_i = x_t + (\sqrt{(L+\lambda)\mathcal{P}_t})_i \text{ for } i=1,\ldots,L \tag{12}$$

$$\eta_i = x_t - (\sqrt{(L+\lambda)\mathcal{P}_t})_i \text{ for } i=L+1,\ldots,2L \tag{13}$$

In Equations (12)-(13), $(\sqrt{(L+\lambda)\mathcal{P}_t})_i$ is the ith column of the matrix square root of $(L+\lambda)\mathcal{P}_t$, $\lambda = \alpha^2(L+\kappa) - L$, and $\mathcal{P}_t$ is the covariance matrix at time t. These points may have weighting factors given, such as shown by Equations (14)-(16):

$$w_{i=0}^{(m)} = \frac{\lambda}{L+\lambda} \tag{14}$$

$$w_{i=0}^{(c)} = \frac{\lambda}{L+\lambda} + (1 - \alpha^2 + \beta) \tag{15}$$

$$w_{i \neq 0}^{(m)} = w_{i \neq 0}^{(c)} = \frac{1}{2(L+\lambda)} \tag{16}$$

In the equations above, the superscripts (m) and (c) indicate that the weighting factor is used in the calculation of the mean and covariance, respectively. The choice of values for $\alpha$, $\beta$, and $\kappa$ is problem dependent.

In these variations, the mean and covariance of the transformed points may be determined using Equations (17)-(19):

$$\chi_i = f(\sigma_i, \Delta t) \tag{17}$$

$$x_{t+\Delta t} = \Sigma_i w_i \chi_i \tag{18}$$

$$\mathcal{P}_{t+\Delta t} = \Sigma_i w_i^{(c)} (\chi_i - x_{t+\Delta t})(\chi_i - x_{t+\Delta t})^T + \mathcal{Q} \tag{19}$$

In Equation (19), the superscript T represents the matrix transpose and $\mathcal{Q}$ is the process noise matrix. In an update operation of the method, where new data is added to the system, the same transform can be applied to the measurement function $h(\ldots)$ with the interferometer data ID, resulting calculations governed by the following equations:

$$\mathcal{Z}_i = h(\chi_i, \text{ID}) \tag{20}$$

$$\mu_z = \Sigma_i w_i(m) \mathcal{Z}_i \tag{21}$$

$$\mathcal{P}_Z = \Sigma_i w_i^{(c)} (\mathcal{Z}_i - \mu_z)^T + \mathcal{R} \tag{22}$$

In Equation (22), $\mathcal{R}$ is the measurement noise matrix. The cross-variance between the two domains may then be determined according to Equation (23):

$$\mathcal{P}_{xZ} = \Sigma_i w_i^{(c)} (\chi_i - x_{t+\Delta t})(\mathcal{Z}_i - \mu_z)^T \tag{23}$$

which is subsequently used in the calculation of the Kalman gain, as shown by Equation (24):

$$K = \mathcal{P}_{xZ} \mathcal{P}_Z^{-1} \tag{24}$$

The residual is then calculated from $y = z - \mu_z$ as shown in Equation (8), and the state and covariance matrix are updated according to Equations (25)-(26):

$$x_{updated} = x_{t+\Delta t} + K \cdot y \tag{25}$$

$$\mathcal{P}_{updated} = \mathcal{P}_{t+\Delta t} - K \mathcal{P}_Z K^T \tag{26}$$

The updated values for x and $\mathcal{P}$ replace $x_t$ and $\mathcal{P}_t$ in the next iteration of the filter.

In some implementations, a laser may be used to generate the optical signal measured by the optical instrument. The laser may operate in various modes that correspond to respective use cases. For example, the laser may operate with stable frequency, scan over a small frequency range (e.g., a few GHz), or tune coarsely between different wavelengths (optical frequency moves by typically 10 s of GHz). Other operating modes are possible. However, these three modes may utilize different Kalman-type filter characteristics, and in many variations, the different filter characteristics are accomplished by tuning the process noise matrix $\mathcal{Q}$.

In some cases, the laser is stable in frequency, either being actively locked or passively drifting at a very small rate. In these cases, the typical behavior is well known and predictable. If the optical system is more predictable, the process noise can be reduced to give more weight to the model and give a tighter estimate of the optical frequency at the cost of reduced time-response to significant changes.

In some cases, a significant variation between measurement and estimate occurs. Such variation can indicate a transition to one of the other operating modes. In these cases, the process noise is adapted depending on how far the measurement is from the estimate using a set of threshold levels. Sudden, large changes in the real optical frequency, e.g., a laser encountering a mode hop where the optical frequency may move by several GHz in a time less than the measurement interval, are managed by effectively resetting the Kalman-type filter. The measurement is accepted as the new state estimate and the rest of the Kalman-type filter variables are reset to their initial values.

In some cases, a smaller deviation of the measurement from the estimate indicates a particularly noisy data point, or alternatively, the start of a scan. In these cases, the process noise is increased gradually. If several data points in a row are far from the estimate, the Kalman-type filter adapts to more heavily weight the measurement, and the $x_4$ term (relating to df/dt) in the state vector will update to a non-zero value, so the optical system becomes better at predicting the slope of the scan. In this example, the scan may be assumed to be linear, which may serve as an adequate approximation for the optical instrument (e.g., such as a wavelength meter).

In many implementations, the final accepted value for the new system state, either the new estimate or the measurement in the case of a large jump in frequency, is fed back to the rest of the optical system for the next iteration. The final accepted value becomes the initial guess for the unfiltered measurement algorithm and is used during the prediction operation 110 in the next iteration of the filter.

Figure 1B:
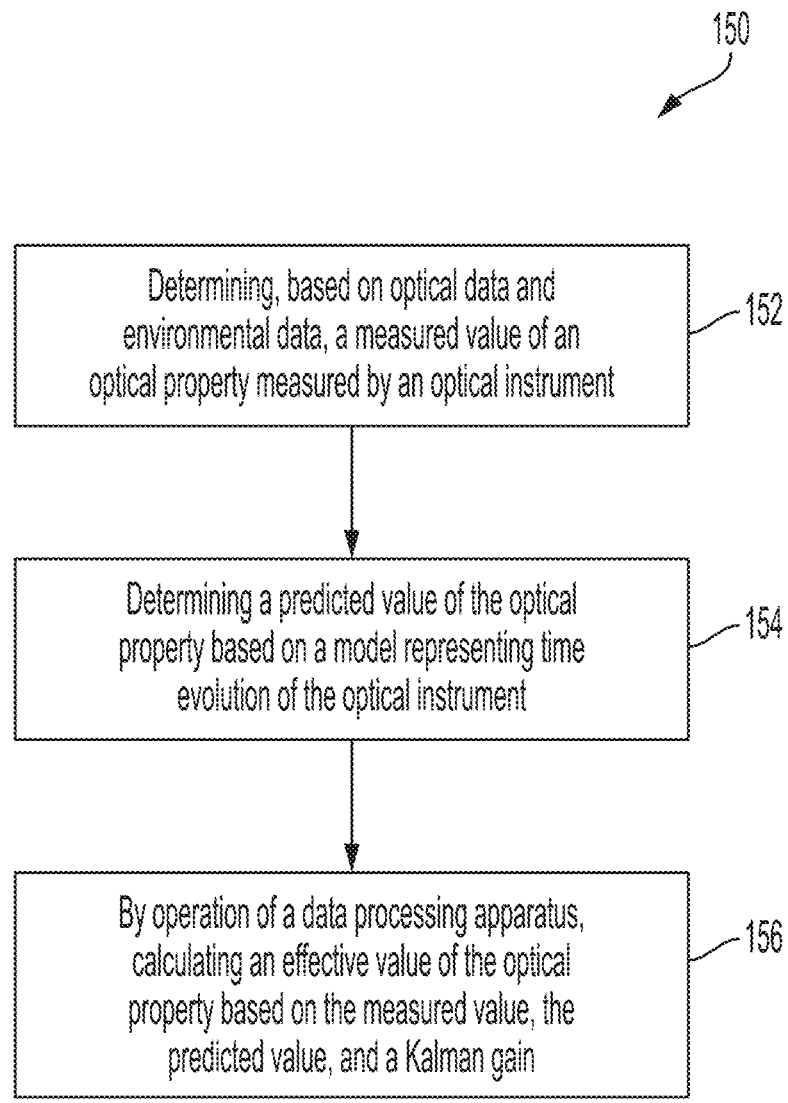
FIG. 1B is a flowchart of an example method for increasing the measurement precision of an optical instrument using a Kalman-type filter.

Now referring to FIG. 1B, a flowchart is presented of an example method 150 for increasing the measurement precision of an optical instrument using a Kalman-type filter. Part or all of the example method 150 may be analogous to the example method 100 described in relation to FIG. 1A. The example method 150 includes the operation 152 of determining, based on optical data and environmental data, a measured value of an optical property measured by the optical instrument. Examples of the optical property include a wavelength or a frequency of light, a phase of light, or an intensity of light. The optical instrument includes an optical path having two reflective surfaces and a transmission medium therebetween. The two reflective surfaces are separated by a distance (d) and the transmission medium has an index of refraction (n). The optical instrument also includes a sensor, which is configured to measure an environmental parameter that influences a magnitude of one or both of the distance and the index of refraction. In some variations, the distance and index of refraction define an optical path length (e.g., l=nd) between the two reflective surfaces. The optical data is generated by the optical instrument in response to an optical signal (e.g., laser light) traversing the optical path, and the environmental data is generated by the sensor measuring the environmental parameter.

The environmental parameter may be associated with the transmission medium of the optical instrument. For example, the environmental parameter may be a temperature (T) of the transmission medium, a pressure (P) of the transmission medium, a humidity (e.g., RH) of the transmission medium, or a concentration ($C_{CO_2}$) of carbon dioxide in the transmission medium. The environmental parameter may also be associated with a mechanical feature of the optical instrument. For example, the environmental parameter may be a length of a spacer separating the two reflective surfaces of the optical instrument. Other types of environmental parameters are possible, including combinations of environmental parameters.

The example method 150 also includes the operation 154 of determining a predicted value of the optical property based on a model representing time evolution of the optical instrument. The example method 150 additionally includes the operation 156 of calculating, by operation of one or more processors, an effective value of the optical property based on the measured value, the predicted value, and a Kalman gain. The Kalman gain is based on respective uncertainties in the measured and predicted values. The Kalman gain also defines a relative weighting of the measured and predicted values in the effective value. In many implementations, the Kalman gain is biased towards the measured value when the uncertainty in the measured value is less than the uncertainty in the predicted value. In these implementations, the Kalman gain is also biased towards the predicted value when the uncertainty in the predicted value is less than the uncertainty in the measured value.

In some implementations, the model representing time evolution of the optical instrument includes state variables and a state vector. The time evolution occurs from a previous period to a current period. In these implementations, the state variables include a first state variable representing the optical property and a second state variable representing the environmental parameter. The state vector includes respective state values for the state variables. Moreover, the method includes determining the Kalman gain based on a measurement noise matrix, a process noise matrix, and a covariance matrix.

The measurement noise matrix includes values representing an uncertainty in the optical and environmental data, and the process noise matrix includes values representing an uncertainty in the model. The covariance matrix includes values representing an uncertainty in the state values. In further implementations, the method includes repeating, over multiple iterations of respective periods, the operations of determining the measured value, determining the predicted value, determining the Kalman gain, and calculating the effective value. The values of the measurement noise matrix, the process noise matrix, the covariance matrix, or any combination thereof, are updated for each iteration.

In some implementations, the model representing time evolution of the optical instrument includes state variables that comprise a first state variable representing the optical property and a second state variable representing the environmental parameter. The model also includes a state vector having respective state values for the state variables The model additionally includes a state evolution function that defines a change in the state values from a first set of state values associated with a previous period to a second set of state values associated with a current period. The time evolution for the model occurs from the previous period to the current period. In these implementations, the operation 154 of determining the predicted value of the optical property includes applying the state evolution function to the first set of state values to generate the second set of state values. The value of the second set of state values for the first state variable is the predicted value. In some variations, the state evolution function includes a plurality of sigma points and respective weighting factors (e.g., such as with the unscented Kalman filter).

In further implementations, the operation 152 of determining the measured value of the optical property includes obtaining measurement values for respective measurement variables of a measurement vector. The measurement variables include a first measurement variable representing the optical property and a second measurement variable representing the environmental parameter. The measurement value obtained for the first measurement variable is the measured value. In these implementations, the operation 156 of calculating the effective value of the optical property includes calculating residual values of a residual vector based on a difference between the measurement values and the second set of state values. Calculating the effective value also includes determining a third set of state values for the state vector based on the second set of state values, the Kalman gain, and the residual values. The third set of state values include the effective value of the optical property.

The measurement variables may define a measurement domain for the measurement vector and the state variables define a state domain for the state vector. If so, the operation 156 of calculating the effective value of the optical property may include applying a measurement function to the second set of state values to generate a converted second set of state values. The measurement function defines a change in the state values upon conversion from the state domain to the measurement domain. Calculating the effective value also includes subtracting the converted second set of state values from the measurement values to calculate the residual values of the residual vector.

Figure 2A:
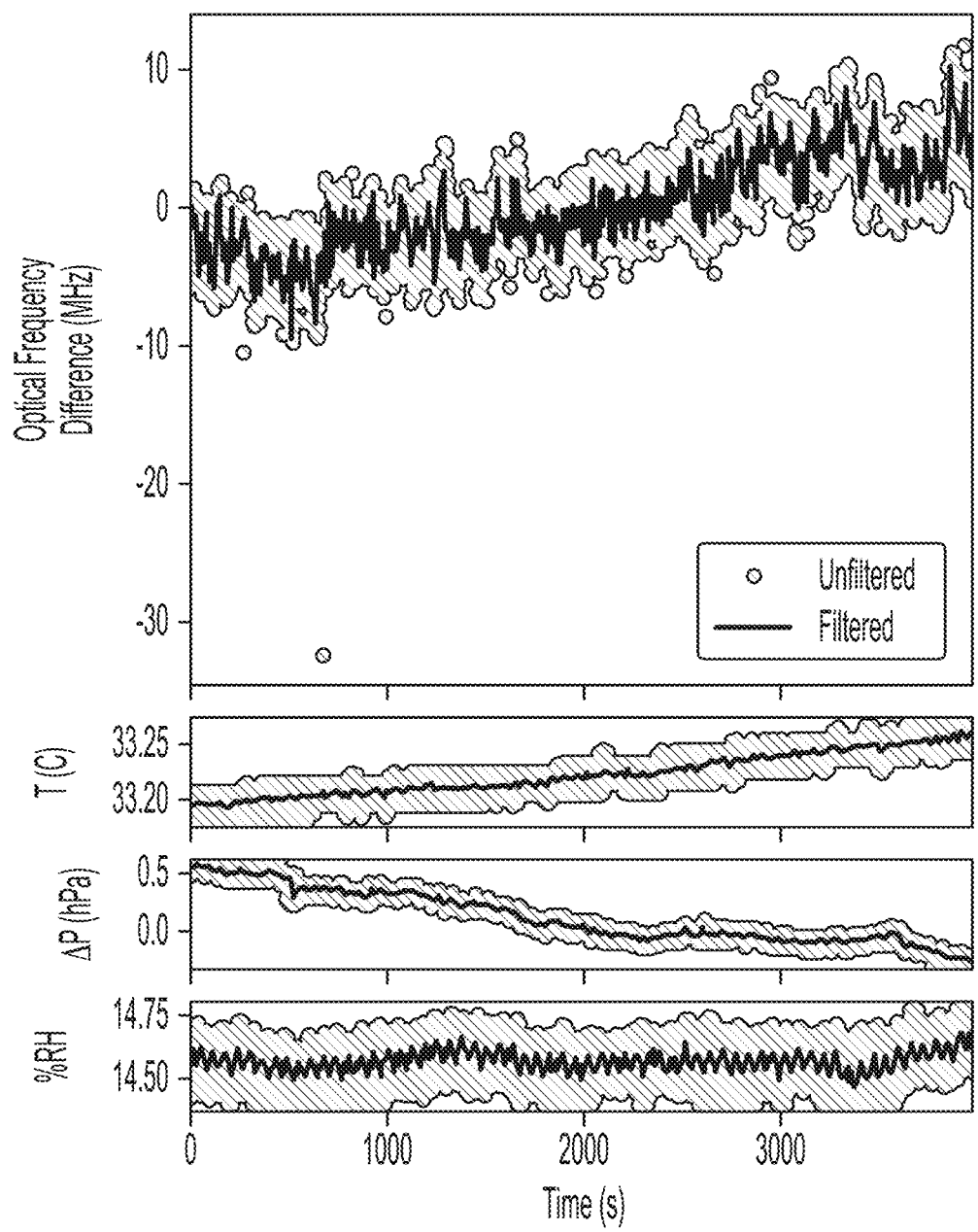
FIG. 2A shows a time-aligned group of graphs presenting example data based on a common set of raw input data, with and without an unscented Kalman filter active.

Now referring to FIG. 2A, a time-aligned group of graphs is presented showing example data based on a common set of raw input data, with and without an unscented Kalman filter active. The example data is generated by a wavelength measurement system analogous to those described in relation to FIGS. 4-6. To generate an optical signal for measurement, an input laser source at a wavelength of 1018.62 nm (i.e., an optical frequency 294.31 THz) was locked to an ultra-stable optical cavity, with expected variation in the wavelength less than 0.2 fm (less than 100 kHz). The example data shown by the hatched dots corresponds to the inactive (or unfiltered) case and the example data shown by the solid line corresponds to the active (or filtered) case. The example data in the inactive case were generated by operating the wavelength measurement system according to the operations 102-108 of FIG. 1A only. For clarity, the example data are presented as a frequency deviation from the average frequency value of the filtered data set.

Figure 2B:
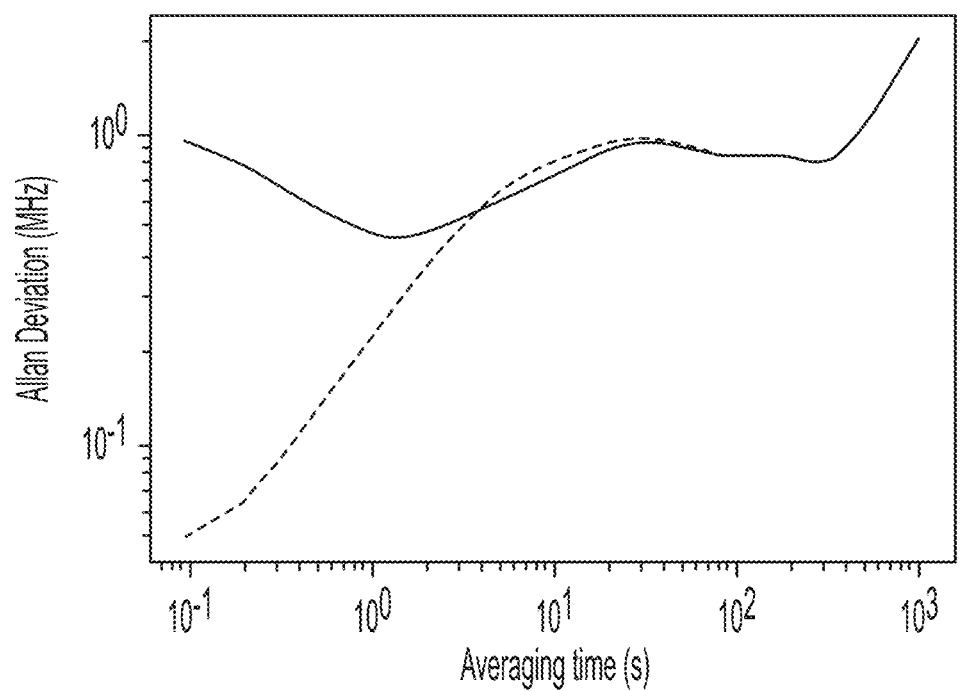
FIG. 2B is a graph of the Allan deviation of the optical frequency data shown in the upper panel of FIG. 2A.

The difference between the unfiltered and filtered example data is clear: The filtered data tracks the average value of the unfiltered data but has much less scatter in the data points. Such behavior is also present in the optical frequency and the three environmental parameters shown in the three panels found below the optical frequency difference measured as a function of time (i.e., the panels associated with temperature, change in pressure, and percent relative humidity). FIG. 2B shows the Allan deviation of the optical frequency data in the upper panel of FIG. 2A. The Allan deviation is commonly used to assess the stability of a given signal over different timescales. Comparison of the Allan deviation for the filtered and unfiltered data shows a clear advantage on the shortest measured timescales, corresponding to the short-term measurement precision, where the filtered data is approximately a factor of 20 better than the unfiltered data. The Allan deviation also shows the long-term behavior of the wavelength measurement system, where the two curves are extremely similar to each other. This similarity indicates that the filter has no detrimental effect on the measurement stability at long time scales. In other words, the reduction of the long-term drift is maintained.

Figure 3A:
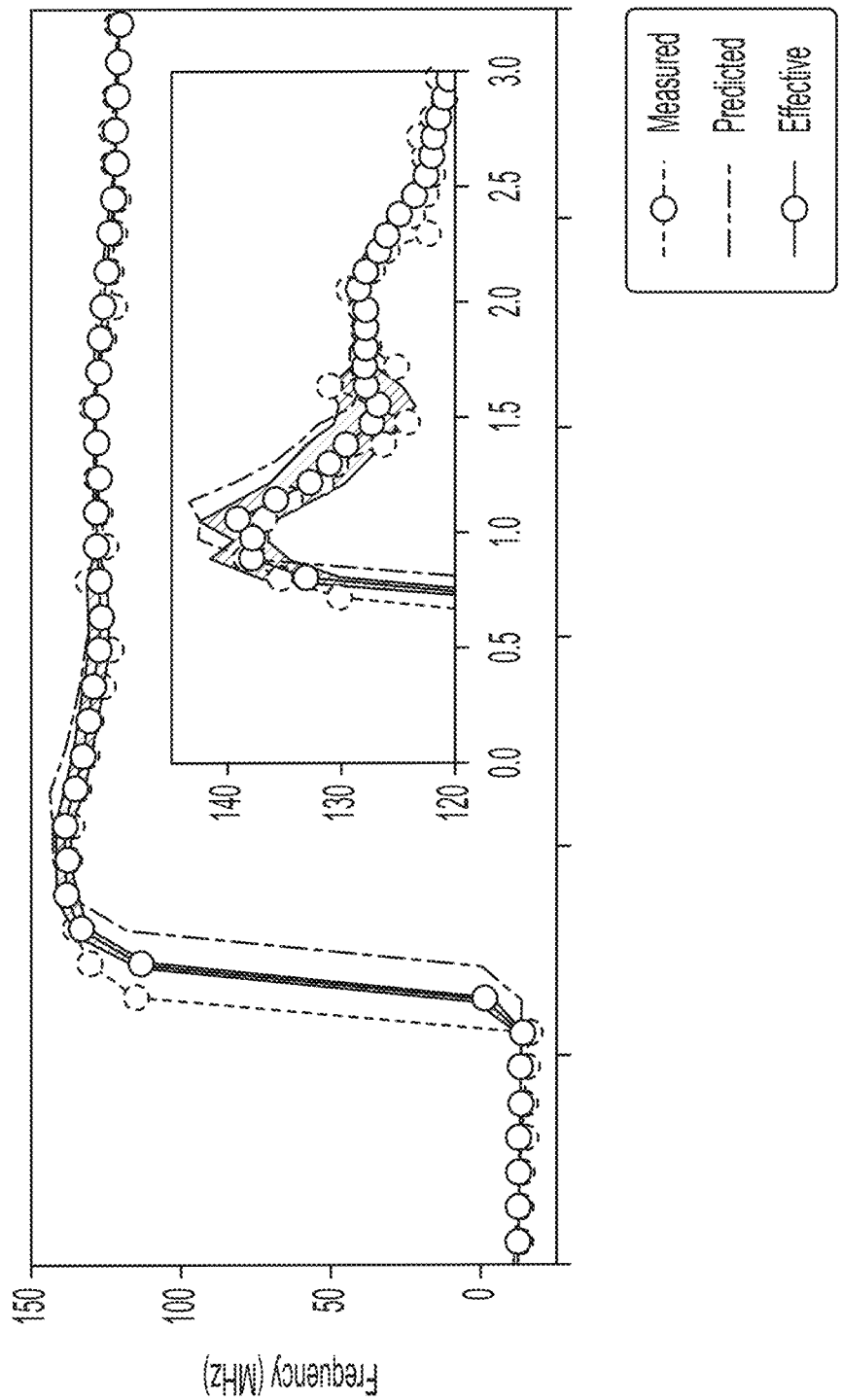
FIG. 3A is a graph of a frequency of light determined over time by applying a Kalman-type filter to measurements made by an optical instrument.
Figure 3B:
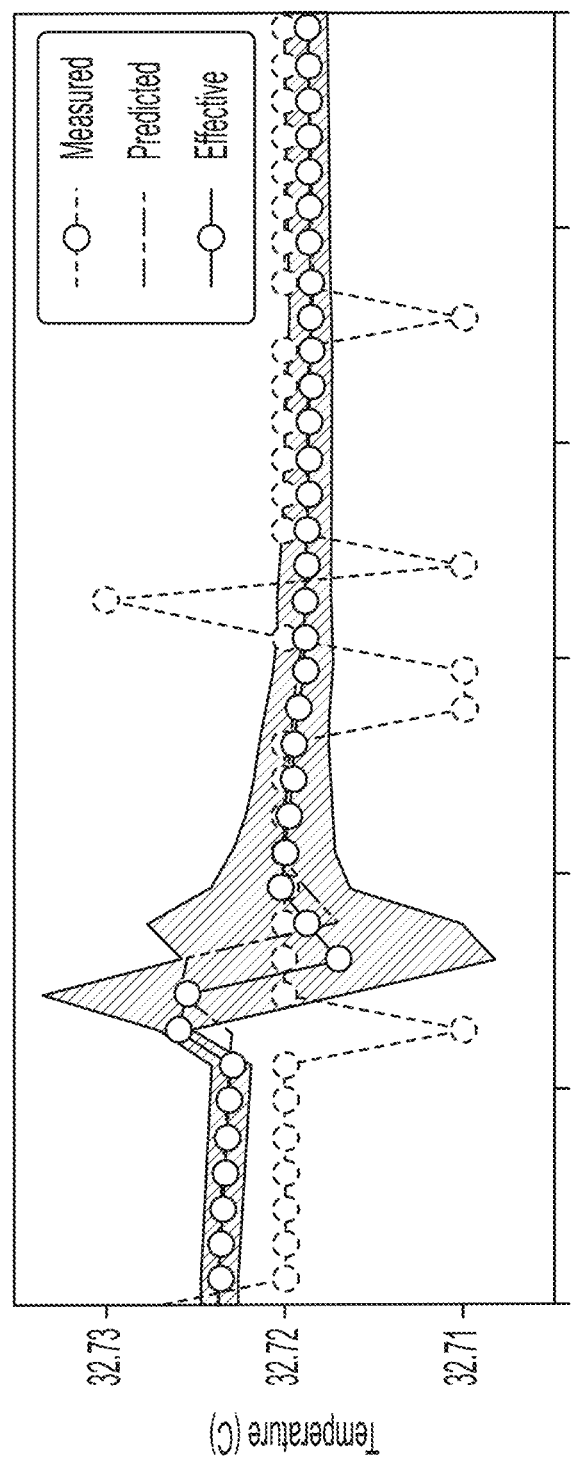
FIG. 3B is a graph of temperature determined over time by applying a Kalman-type filter to measurements made by a temperature sensor of the optical instrument of FIG. 3A.
Figure 3C:
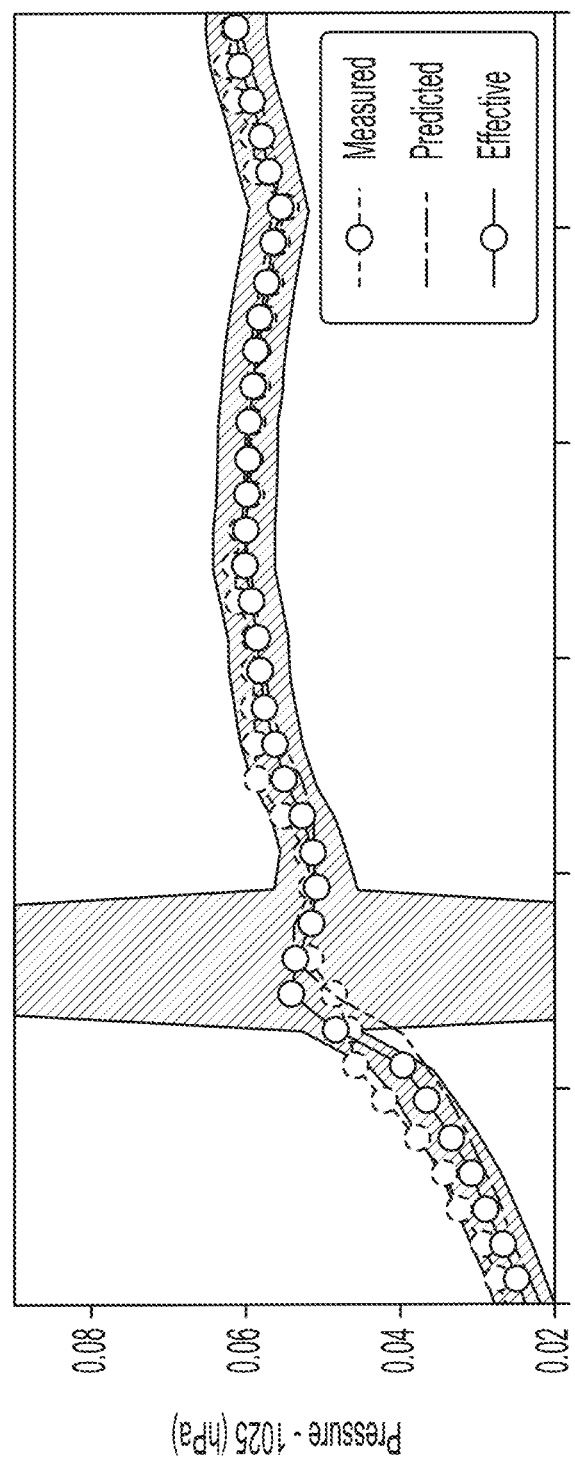
FIG. 3C is a graph of pressure determined over time by applying a Kalman-type filter to measurements made by a pressure sensor of the optical instrument of FIG. 3A.
Figure 3D:
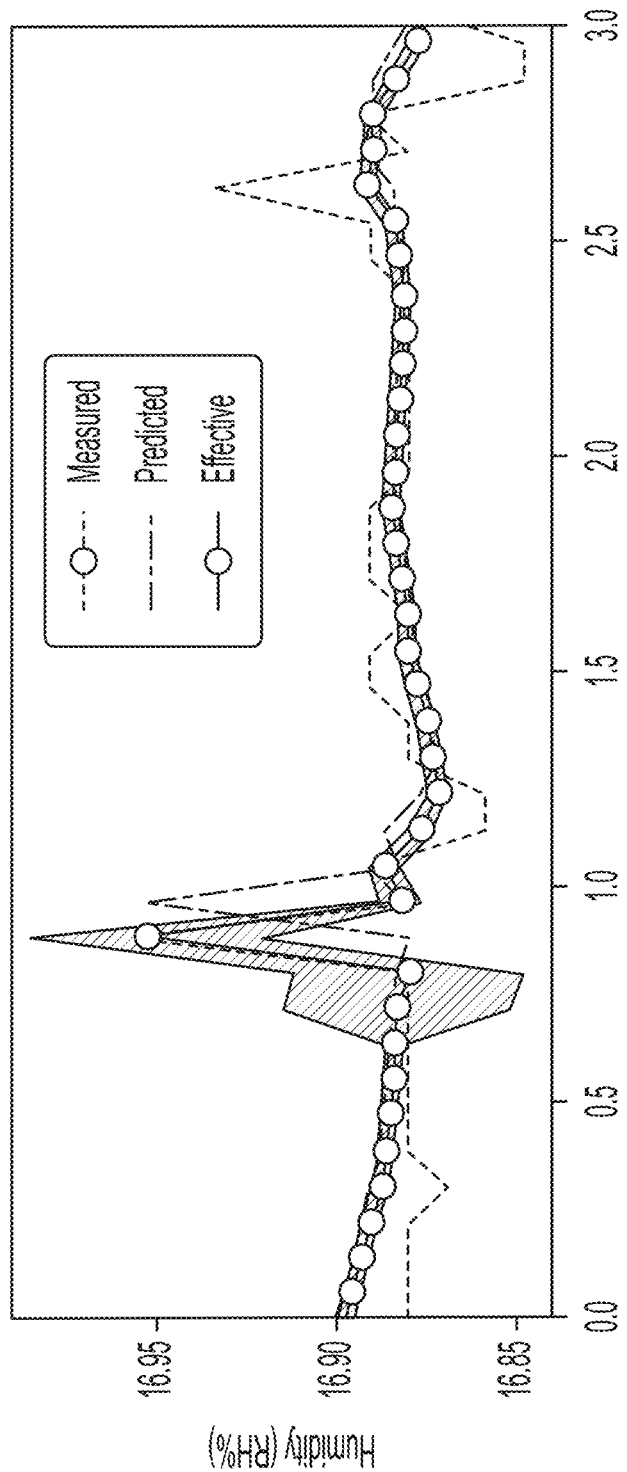
FIG. 3D is a graph of relative humidity determined over time by applying a Kalman-type filter to measurements made by a humidity sensor of the optical instrument of FIG. 3A.

Now referring to FIG. 3A, a graph is presented of a frequency of light determined over time by applying a Kalman-type filter to measurements made by an optical instrument. The graph shows examples of measured, predicted, and effective values for the frequency of light. In some instances, these values are determined in conjunction with applying the Kalman-type filter to environmental variables measured by a sensor of the optical instrument. For example, FIG. 3B presents a graph of a temperature determined over time by applying a Kalman-type filter to measurements made by a temperature sensor of the optical instrument. The graph shows examples of measured, predicted, and effective values for the temperature. Similarly, FIG. 3C presents a graph of a pressure determined over time by applying a Kalman-type filter to measurements made by a pressure sensor of the optical instrument. The graph shows examples of measured, predicted, and effective values for the pressure. FIG. 3D presents a graph of a relative humidity determined over time by applying a Kalman-type filter to measurements made by a humidity sensor of the optical instrument. The graph shows examples of measured, predicted, and effective values for the relative humidity. The effective values for the temperature, the pressure, and/or the relative humidity may be used by the Kalman-type filter when generating the measured, predicted, and/or effective values for the frequency of light.

Figure 4:
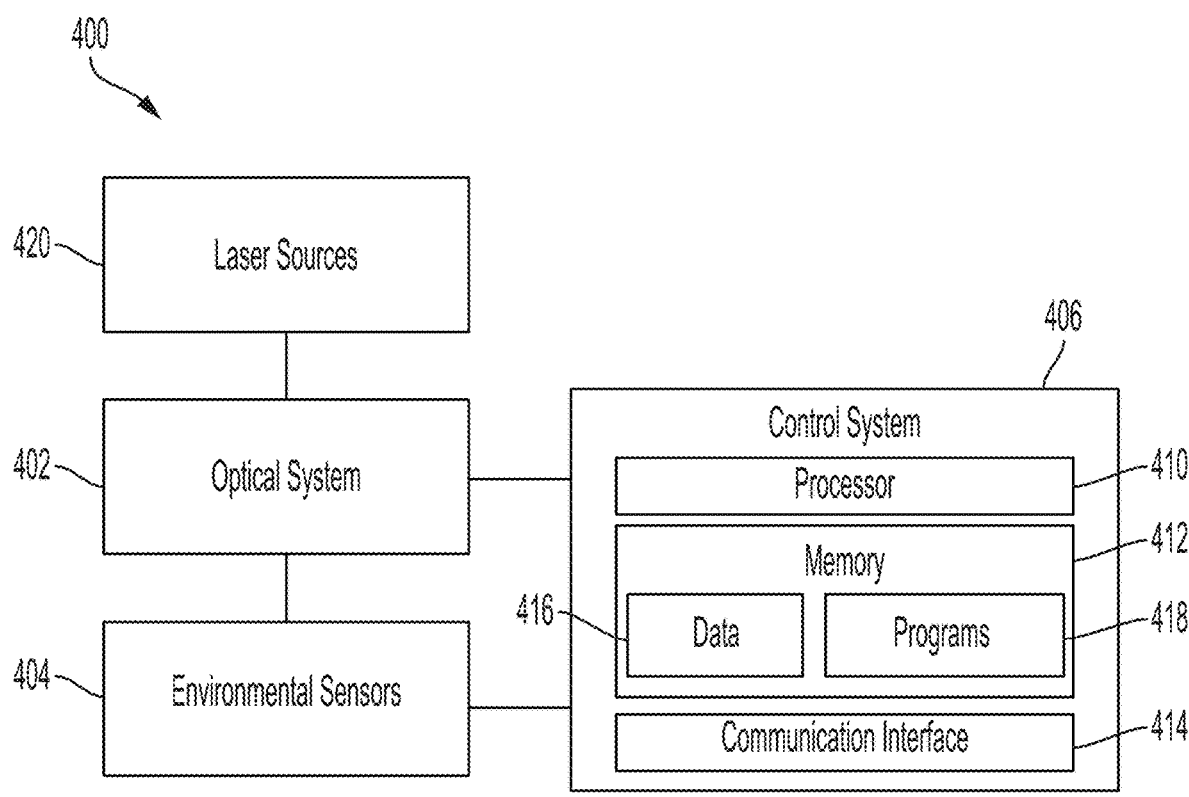
FIG. 4 is a schematic diagram of an example system for wavelength measurement.

Now referring to FIG. 4, a schematic diagram is presented of an example wavelength measurement system 400. The example wavelength measurement system 400 includes an optical system 402, environmental sensors 404, and a control system 406. However, additional features are possible for the example wavelength measurement system 400.

In some implementations, the optical system 402 may be coupled to two or more laser sources 420, such as a reference laser source and a test laser source. In some implementations, the reference laser source may be used to generate a reference laser beam with a known wavelength. In some implementations, the reference laser source may be used for calibrating the wavelength measurement system 400. In some implementations, the test laser source may generate a laser beam with an unknown wavelength that can be measured by the example wavelength measurement system 400 prior to being used in other applications.

In some implementations, the optical system 402 may include a series of optical elements that define one or more beam paths between the two or more laser sources 420 and a camera system. In some examples, the series of optical elements in the optical system 402 may include an optical switch, one or more lenses, one or more mirrors, a beam splitter, and one or more interferometers. In some implementations, the optical system 402 may be implemented as the optical system 504 shown in FIGS. 5A-5B. However, other implementations of the optical system 402 are possible. In some implementations, the optical switch may be configured to select and route an input laser beam at a first input port or a second laser beam at a second input port to an output port of the optical switch. In some implementations, the laser beam from the output port of the optical switch is collimated by the one or more lenses.

In some implementations, a collimated laser beam exiting the one or more lenses may be guided through the interferometers. In some instances, the interferometers including at least two different interferometer lengths can facilitate reliable and efficient fitting of the wavelength of the test laser beam. In some instances, the interferometers may include dual Fizeau interferometers, Fabry-Perot interferometers, Michelson interferometers, or other types of interferometers. In certain implementations, the optical system 402 includes a camera system which may be configured at a position to optically couple to the interferometers. In some instances, the camera system may be used to detect one or more interferograms.

In some implementations, the environmental sensors 404 may include at least one of a temperature sensor, an atmospheric pressure sensor, and a humidity sensor. In some implementations, the environmental sensors 404 are configured in proximity to the interferometer in the optical system 402. In some implementations, the environmental sensors 404 may be configured for in-situ monitoring of environmental parameters of the transmission medium in the interferometer cavities in order to determine a refractive index of a transmission medium in the interferometers, e.g., air. In some implementations, sensor data representing values of the environmental parameters may be produced by the environmental sensors, including a temperature (T), an atmospheric pressure (P), and a humidity (H). In some implementations, the environmental sensors 404 may further include a carbon dioxide ($CO_2$) sensor to generate the sensor data including $CO_2$ concentration data in the transmission medium. In some implementations, the refractive index may be determined by the control system 406 using a refractive index computation algorithm. In some implementations, the environmental sensors 404 may include additional temperature sensors, e.g., positioned on the interferometers, to compensate a thermal expansion effect in the interferometer.

In the example shown in FIG. 4, the control system 406 includes a processor 410, memory 412, and a communication interface 414. The control system 406 may include additional components, such as, for example, input/output controllers, communication links, power for the optical system or the environmental sensors, a display device, and an input device. In some examples, the control system 406 may be used to operate the optical switch in the optical system 402 to switch between the different input laser sources. In some examples, the control system 406 may be used to communicate with the camera system of the optical system 402 and the environmental sensors 404 through the communication interface 414. For example, the control system 406 may receive data 416 for signal processing (e.g., performing an example process 800 for calibrating the wavelength measurement system as described in relation to FIG. 8 or performing an example process 900 for wavelength measurement as described in relation to FIG. 9). In some instances, the control system 406 may be used to implement one or more aspects of the systems and techniques described with respect to FIGS. 5A-9, or to perform other types of operations.

In some implementations, some of the processes and logic flows described in this specification may be performed by one or more programmable processors, e.g., processor 410, executing one or more computer programs to perform actions by operating on input data and generating output. For example, the processor 410 may run the programs 418 by executing or interpreting scripts, functions, executables, or other modules contained in the programs 418. In some implementations, the processor 410 may perform one or more of the operations described, for example, with respect to FIGS. 8 and 9.

In some implementations, the processor 410 may include various kinds of apparatus, devices, and machines for processing data, including, by way of example, a programmable data processor, a system on a chip (SoC, or multiple ones, or combinations, of the foregoing). In certain instances, the processor 410 may include special purpose logic circuitry, e.g., an FPGA (field programmable gate array), an ASIC (application specific integrated circuit), or a Graphics Processing Unit (GPU). In some instances, the processor 410 may include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. In some examples, the processor 410 may include, by way of example, both general and special purpose microprocessors, and processors of any kind of digital computer.

In some implementations, the processor 410 may include both general and special purpose microprocessors, and processors of any kind of digital computer. Generally, a processor 410 will receive instructions and data from a read-only memory or a random-access memory or both (e.g., memory 412). In some implementations, the memory 412 may include all forms of non-volatile memory, media, and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. In some cases, the processor 410 and the memory 412 may be supplemented by, or incorporated in, special purpose logic circuitry.

In some implementations, the data 416 stored in the memory 412 may include data received from the camera system of the optical system 402 and from the environmental sensors 404. In some implementations, the data 416 stored in the memory 412 may also include information associated with the reference laser beam (e.g., wavelength or frequency, Gaussian envelope parameters, etc.). In some implementations, the programs 418 may include software applications, scripts, programs, functions, executables, or other modules that are interpreted or executed by the processor 410. In some instances, the programs 418 may include machine-readable instructions for receiving data of environmental parameters of the transmission medium (e.g., air) in the interferometer and for performing a wavelength measurement process to evaluate the refractive index of the transmission medium. In some instances, the programs 418 may include machine-readable instructions for controlling the optical switch of the optical system 402 to switch between the different input laser sources.

In some instances, the programs 418 may access the data 416 from the memory 412, from another local source, or from one or more remote sources (e.g., via a communication link). In some instances, the programs 418 may generate output data and store the output data in the memory 412, in another local medium, or in one or more remote devices (e.g., by sending the output data via the communication interface 414). In some examples, the programs 418 (also known as, software, software applications, scripts, or codes) can be written in any form of programming language, including compiled or interpreted languages, declarative, or procedural languages. In some implementations, the programs 418 can be deployed to be executed on one computer or on multiple computers that are located at one site or distributed across multiple sites and interconnected by a communication network. For instance, the programs 418 may operate in the cloud, and the control system 406 may access the programs 418 through an Internet connection.

In some implementations, the communication interface 414 may include any type of communication channel, connector, data communication network, or other link. In some instances, the communication interface 414 may provide communication channels between the control system 406 and the optical system 402, the environmental sensors 404, or other systems or devices. In some instances, the communication interface 414 may include a wireless communication interface that provides wireless communication under various wireless protocols, such as, for example, Bluetooth, Wi-Fi, Near Field Communication (NFC), GSM voice calls, SMS, EMS, or MMS messaging, wireless standards (e.g., CDMA, TDMA, PDC, WCDMA, CDMA2000, GPRS, etc.) among others. In some examples, such communication may occur, for example, through a radio-frequency transceiver or another type of component. In some instances, the communication interface 414 may include a wired communication interface (e.g., USB, Ethernet, etc.) that can be connected to one or more input/output devices, such as, for example, a keyboard, a pointing device, a scanner, or a networking device such as a switch or router, for example, through a network adapter.

Figure 5A:
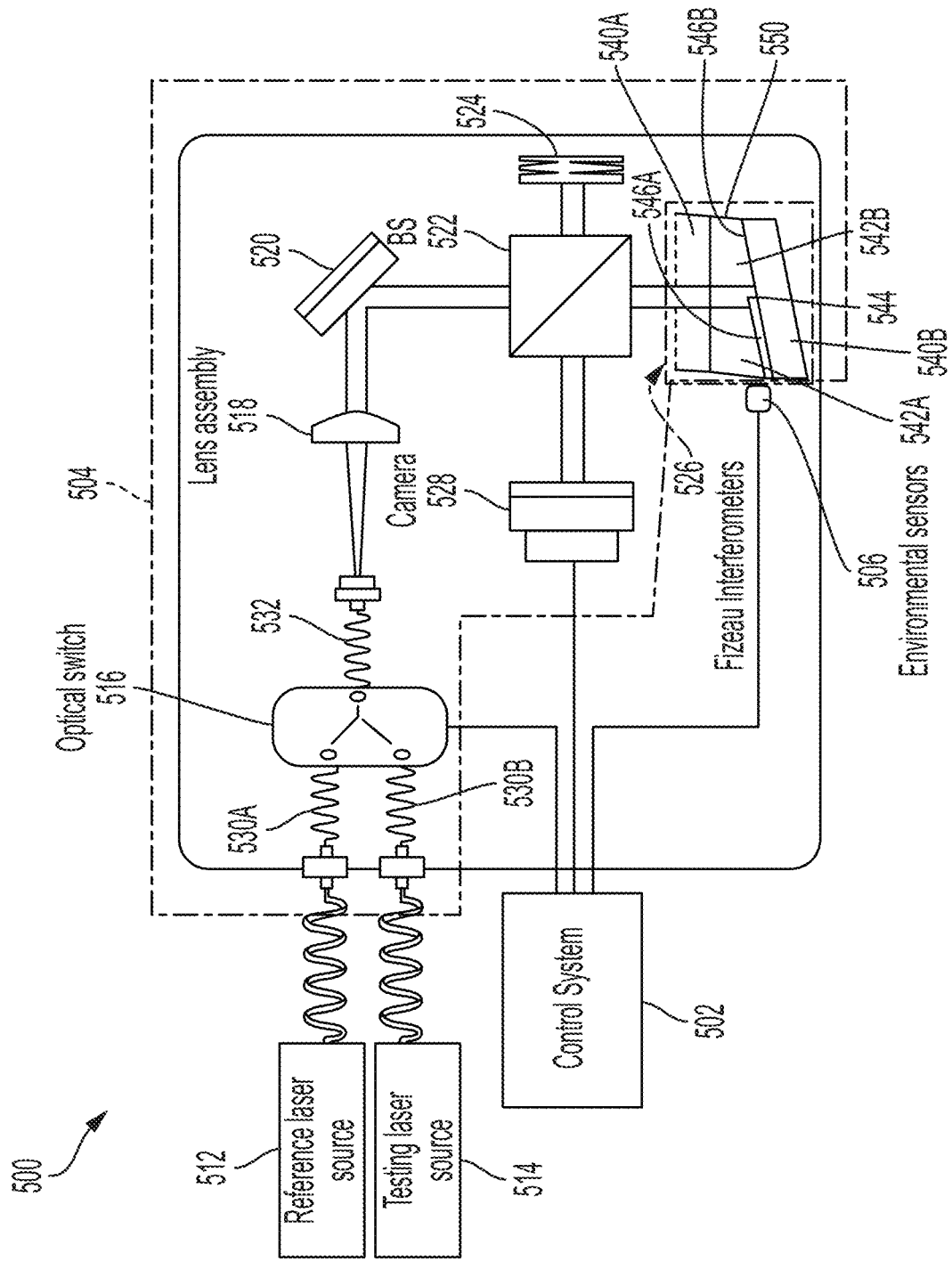
FIG. 5A is a schematic diagram of an example system for wavelength measurement.
Figure 5B:
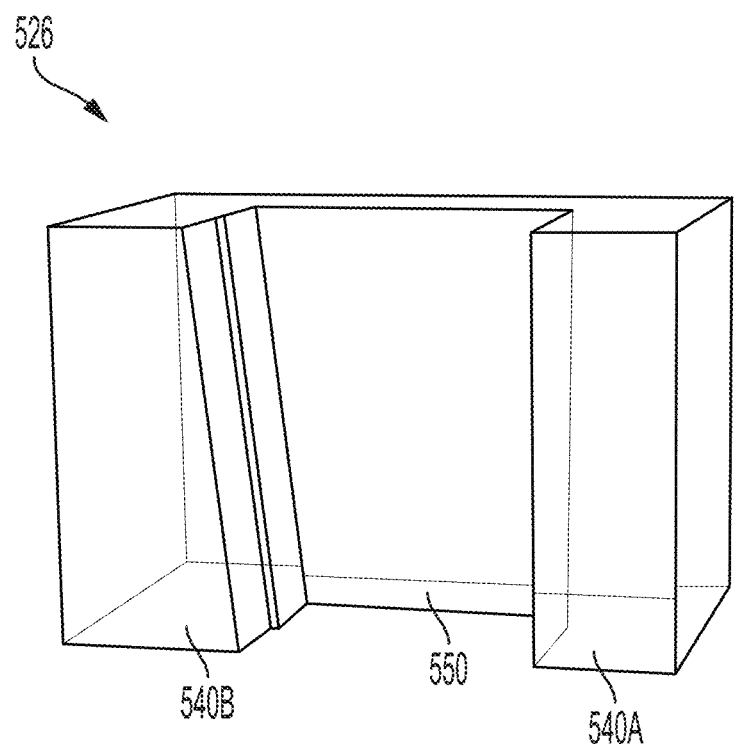
FIG. 5B is a schematic diagram of an example interferometer.

FIG. 5A presents a schematic diagram of an example wavelength measurement system 500 for wavelength (or frequency) measurement of an optical signal. FIG. 5B presents a detailed view of an interferometer 526 of the example wavelength measurement system 500. The example wavelength measurement system 500 may correspond to a wavelength meter and the optical signal may be generated by a laser. In some instances, the example wavelength measurement system 500 shown in FIG. 5A may be used for performing a wavelength measurement, e.g., the processes described in relation to FIGS. 8 and 9. In the example shown in FIG. 5A, the wavelength measurement system 500 includes a control system 502, an optical system 504, and environmental sensors 506. As shown in FIG. 5A, the optical system 504 includes a series of optical elements that define one or more beam paths between one or more lasers and a camera system. In the example shown, the series of optical elements in the optical system 504 includes an optical switch 516, a lens assembly 518, a mirror 520, a beam splitter 522, a beam stop 524, the interferometer 526, and a camera system 528. In some examples, the wavelength measurement system 500 may include additional or different components, and the components may be arranged as shown or in another manner.

In some instances, the optical system 504 may receive one or more laser beams from a reference laser source 512 and a test laser source 514. In the example shown in FIG. 5A, the reference laser source 512 may be used to generate a reference laser beam with a known frequency. In some implementations, the test laser source 514 may be used to generate a laser beam with unknown frequency/wavelength that needs to be measured before being used in other applications. In some implementations, the reference laser source 512 may be used for recalibration or in-situ calibration purposes, for example, after a substantial reconfiguration to the system 500 is performed. However, recalibration using the reference laser source may not be required once the system 500 is calibrated.

In some implementations, the reference laser source 512 may be actively stabilized, e.g., locked to an atomic frequency reference, in which frequency intervals between some atomic transitions may be known with high accuracy. For example, optical absorption caused by the D1 transition (the $6^2S_{1/2} \rightarrow 6^2P_{1/2}$ transition) or the D2 transition (the $6^2S_{1/2} \rightarrow 6^2P_{3/2}$ transition) in a cesium (Cs) atom can be used to provide an absolute frequency reference for calibrating the example wavelength measurement system 500. In some examples, the reference laser source 512 may provide high precision and frequency stability better than 3 parts in $10^{10}$, or 100 kHz precision for an approximately 300 THz frequency. In some other examples, the reference laser source 512 may contain another type of laser source with different precision. For example, a HeNe laser with reduced precision can be used as the reference laser source 512. In one example, the reference laser source 512 may output a reference laser beam with a wavelength at 852.356 nm, which corresponds to an optical frequency of 351.722 THz. In some instances, the reference laser source 512 is locked to an atomic transition of Cs using an ultra-stable optical cavity, with a variation in wavelength less than 0.2 fm (e.g., a variation in frequency less than 100 kHz).

In some implementations, the optical switch 516 can selectively switch optical signals from one input port to another. The optical switch 516 may be an optical router or a mechanically actuated mirror. In some variations, the optical switch 516 may operate by a mechanical method, such as shifting from one fiber coupled to a laser source (e.g., a reference laser source 512) to another fiber coupled to a different laser source (e.g., a test laser source 514). However, in many implementations, the optical switch 516 includes a microelectromechanical system (MEMS) optical switch. In some examples, the optical switch 516 may include one or more mirrors, tilting angles of which may be digitally controlled by the control system 502. In some examples, the optical switch 516 may have two or more input ports and one or more output ports. In the example system 500 shown in FIG. 5A, the optical switch 516 may route a first laser beam at a first input port 530A or a second laser beam at a second input port 530B to an output port 532. In some examples, the optical switch 516 may provide the same optical path to the input laser beams. In certain examples, the optical switch can allow multiple lasers to be measured. In some implementations, the optical switch 516 may be capable of coupling to various optical fibers, e.g., single-mode optical fibers, multi-mode optical fibers, or polarization-maintaining optical fibers. In some examples, the optical switch 516 may be selected according to the frequency range of the input laser beams. In some examples, the optical switch 516 may have low insertion loss and may operate at low voltage to prevent additional thermal load to the example system 500.

In some implementations, the laser beam from the output port 532 of the optical switch 516 may be collimated by the lens assembly 518. In some implementations, the lens assembly 518 contains one or more collimating lenses, which are oriented in a direction perpendicular to the incident direction of the laser beam from the output port 532. In some implementations, the collimating lenses 518 are achromatic to minimize beam divergence at different wavelengths.

In some implementations, optical fibers may be used to guide the laser beam from the laser sources 512, 514 to the optical switch 516. In some implementations, the optical fibers may include single-mode optical fibers to improve the quality of the laser beam or multi-mode optical fibers to maintain the intensity of the laser beam. In some implementations, an optical fiber may be also used to guide the laser beam from the optical switch 516 to the lens assembly 518. In certain instances, the optical fibers may be implemented as polarization-maintaining optical fibers, photonic-crystal fibers, or another type of optical fiber.

In some implementations, the collimated laser beam exiting the lens assembly 518 is then guided through the beam splitter 522. In some instances, prior to the collimated laser beam propagating through the beam splitter 522, the collimated laser beam may be redirected by the first mirror 520 along a different direction (e.g., from a horizontal direction to a vertical direction). In some instances, the beam splitter 522, which is partially reflective and partially transmissive, is used to split the incident laser beam into two beams, each along a separate path (e.g., a transmitted path and a reflected path). In some examples, the beam stop 524 may be placed in the path (e.g., the reflected path) of the beam splitter 522. In some examples, the beam stop 524 is a beam dump which prevents the laser on the reflected path from contributing to the interferograms. In some examples, the interferometer

526 may be positioned in the other path (e.g., the transmitted path) of the beam splitter 522.

In some implementations, the interferometer 526 may include at least two glass pieces facing each other. In some instances, the interferometer 526 may include ultra-low-expansion glass. In the example shown in FIG. 5B, a first glass piece 540A is configured perpendicular to the incident laser beam and the second glass piece 540B is angled by a wedge angle relative to the perpendicular direction (e.g., as shown in the schematic ray diagrams of FIGS. 10A-10C). In some instances, a first surface of the first glass piece 540A facing the incident laser beam may be coated with one or more anti-reflective coatings for enhanced operation at a specific wavelength or a set of wavelengths. In some instances, respective thicknesses of the one or more anti-reflective coatings may be determined by a wavelength range, and refractive indices of the transmission medium and the first glass piece 540A. In some instances, the first surface of the first glass piece 540A may be uncoated for broadband operation. In some instances, a second, opposing surface of the first glass piece 540A and a first surface of the second glass piece 540B which are configured facing each other, are coated with a reflective coating. In some implementations, the reflective coating may include a layer of metal, metal alloy or dielectric material. For example, the reflective coating may include aluminum, silver, gold, chrome, copper, nickel, titanium, and Inconel or a layered dielectric material including silicon dioxide ($SiO_2$) and titanium dioxide ($TiO_2$).

As shown in FIG. 5A, two interferometer cavities 542A, 542B with two different interferometer lengths are created by creating a step 544 on the first surface of the second glass piece 540B. In some implementations, a portion of the transmitted laser beam from the beam splitter 522 is incident on a wedged surface 546A of the step 544 and a portion of the transmitted laser beam is incident on a bottom wedged surface 546B. The bottom wedged surface 546B is displaced from the wedged surface 546A by the step 544. In some instances, the wedged surface 546A is displaced by 0.39 mm from the bottom wedged surface 546B by the step 544, e.g., the height of the step 544 is 0.39 mm. The reflected laser beam from the wedged surface 546A and the bottom wedged surface 546B can effectively create the two interferometer cavities 542A, 542B, e.g., dual Fizeau interferometers. In some examples, a difference in interferometer lengths of the dual Fizeau interferometers is the height of the step 544. For example, the two interferometer lengths are 20.00 and 19.61 mm. In some instances, the reflected laser beam from the interferometers may be spatially patterned with two separate interference patterns (e.g., interferograms), which may have different periodicity and/or phase owing to the different interferometer lengths (e.g., the interferograms 702A, 702B shown in FIG. 7A). In addition, the dual Fizeau interferometers may be constructed as a single monolithic piece, e.g. from a single piece of glass, or several pieces that are fused together. In some implementations, the interferometers may include more than two interferometer cavities and the interferometer cavities may be created in another manner, e.g., different wedge angles.

In some implementations, the interferograms from the interferometers 526 can be captured by the camera system 528. In some instances, each of the interferograms may include a series of interference fringes. To a first-order approximation, the series of interference fringes is generated when the interferometer length coincides with $m\lambda/2$, where m is an integer representing an interference order, and $\lambda$ is the wavelength of the laser beam. In some implementations, the spacing and positions of the interference fringes may be used to calculate the wavelength $\lambda$ by inferring m, if the interferometer length is known. In some instances, the interferometer lengths may be determined from a calibration process, e.g., the example process 800 described in relation to FIG. 8 or in another manner.

In some implementations, the camera system 528 may include an array of image sensors, each of which may be a Charge Coupled Device (CCD) sensor and a complementary metal-oxide semiconductor (CMOS) sensor. In certain implementations, the camera system 528 may be configured at a position in the example system 500 to receive the combined laser beams from the beam splitter 522 to record a full spatial intensity profile of the interferograms from the beam splitter 522.

In some implementations, the environmental sensors 506 may include one or more temperature sensors, one or more atmospheric pressure sensors, and one or more humidity sensors. In some implementations, the environmental sensors 506 are disposed in proximity to the interferometer 526. In some implementations, the environmental sensors 506 may be configured for in-situ monitoring of environmental parameters of the transmission medium in the interferometer cavities 542A, 542B, including temperature (T), atmospheric pressure (P), and humidity (H). In some instances, the environmental parameters monitored by the environmental sensors 506 may be used to determine the refractive index of the transmission medium (e.g., air) within the interferometer cavities 542A, 542B of the interferometer 526.

The environmental sensors 506 may be selected according to design requirements, including detection range, sensitivity, accuracy, response time, repeatability, size, and power consumption. In some implementations, the environmental sensors 506 are calibrated prior to measuring operations or in-situ by comparing to respective reference sensors, which have been accurately calibrated.

In some implementations, the environmental sensors 506 may further include one or more separate temperature sensors for measuring a temperature of the single monolithic piece of glass of the interferometer. In some implementations, the one or more separate temperature sensors can be used to measure a temperature of an interferometer spacer 550, which is used to separate the first and second glass pieces 540A, 540B. In some implementations, the temperature data of the interferometer generated by the one or more separate temperature sensors may be used in a thermal expansion model for compensating for a thermal expansion effect on the wavelength measurement. In some instances, the thermal expansion effect may be modeled on the entire monolithic piece of the interferometer using a linear model, a high-order model, or in another manner. In certain examples, a linear model $\Delta L = \gamma \Delta T \cdot L$ can be used, where $\Delta L$ is the change in the interferometer length, $\gamma$ is the thermal expansion coefficient, $\Delta T$ is the change in temperature, and L is the interferometer length. In some instances, the thermal expansion coefficient in the linear model may be determined by applying a known laser frequency and holding the interferometer at controlled, different temperatures and determining the change in the interferometer length as the interferometer resonance shifts. In some instances, the thermal expansion effect may be calibrated, and the thermal expansion coefficient may be determined prior to performing a wavelength measurement. In some instances, thermal expansion effects on other geometries of the interferometer 526 especially when the interferometer is implemented in another manner may be also measured and calibrated, for example, the incident angle of the incident laser on the second glass piece 540B.

In some implementations, the environmental sensors 506 may be configured within a housing (not shown) of the example system 500, which may be used to enclose the example system 500 from dust accumulation. The example system 500 may or may not be hermetically sealed in the housing. In some examples, the example system 500 is configured without a housing and open to the environment.

In some implementations, different types of temperature sensors may be implemented, including contact and non-contact temperature sensors. In some implementations, a contact type temperature sensor may be a thermostat, a thermistor, a thin film resistive sensor, or a thermocouple. In some implementations, a humidity sensor may be a capacitive sensor, a resistive sensor, or a thermal conductivity sensor. In some implementations, an atmospheric pressure sensor may be an absolute pressure sensor, or a differential pressure sensor. In some examples, the atmospheric pressure sensor may be a MEMS Barometric pressure sensor that is capable of measuring atmospheric pressure using a small and flexible structure. In some examples, the MEMS Barometric pressure sensor may be used to measure dynamic or static air pressure within the interferometer cavities 542A, 542B. In some implementations, other types of environmental sensor may be used.

In some implementations, the environmental sensors 506 may further include one or more carbon dioxide ($CO_2$) sensors. In some examples, the one or more $CO_2$ sensors include a chemical gas sensor. In some instances, a chemical $CO_2$ gas sensor may be a MEMS $CO_2$ gas sensor that uses chemical sensitive layers to measure the $CO_2$ concentration levels in the interferometer cavities 542A, 542B. In some instances, other types of $CO_2$ gas sensor may be used according to its detection range and selectivity over other gas molecules.

Figure 8:
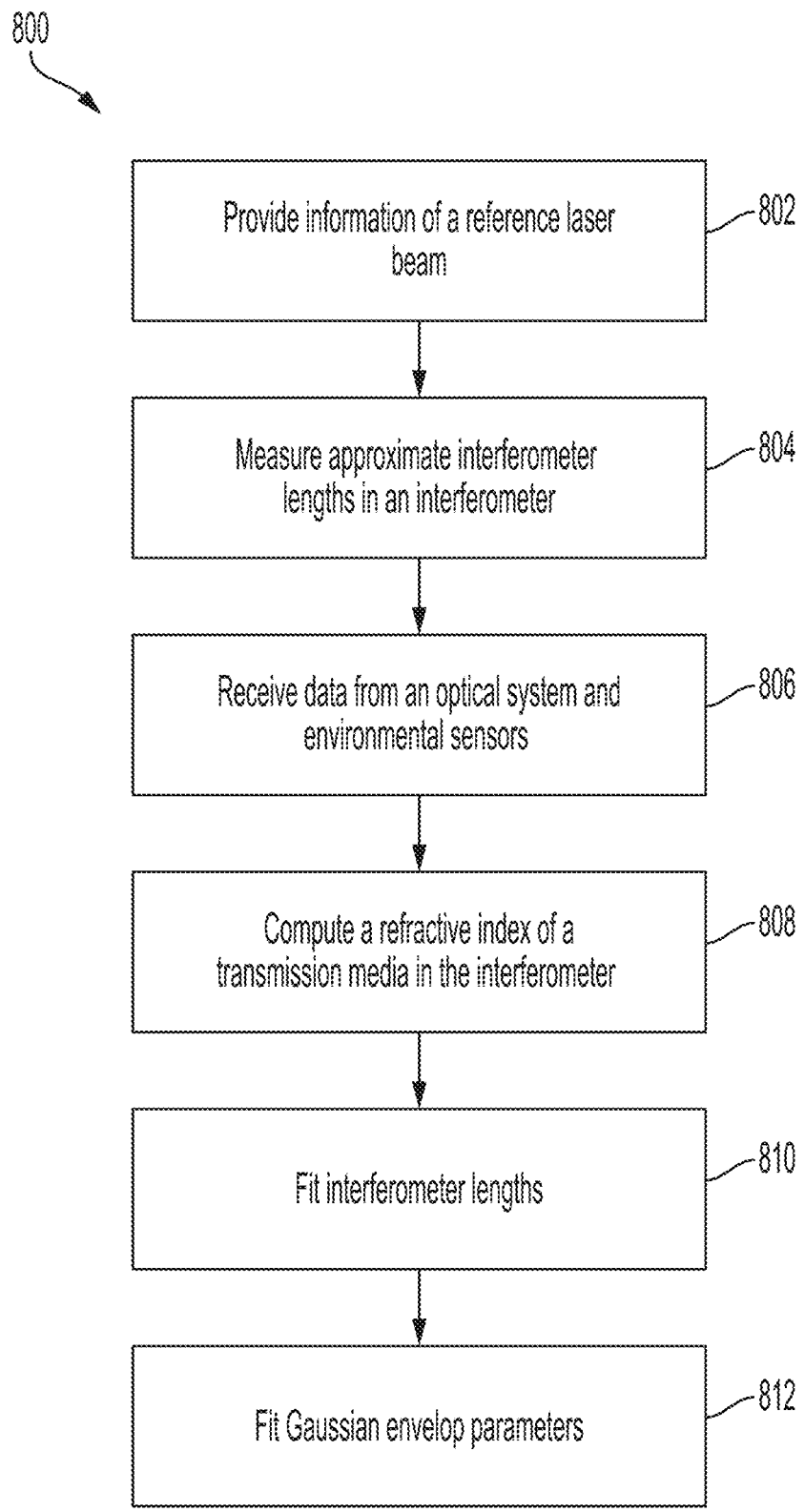
FIG. 8 is a flow chart showing an example process for calibrating a wavelength measurement system.
Figure 9:
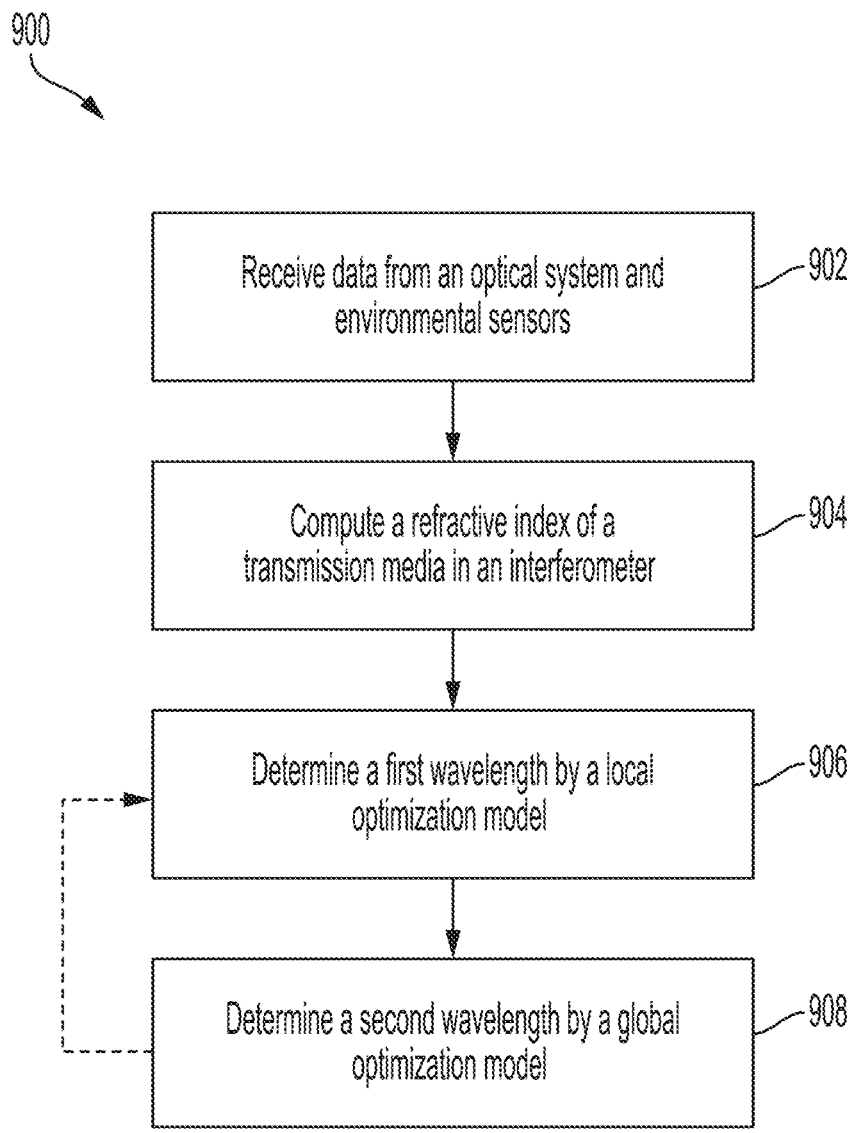
FIG. 9 is a flow chart showing an example process for performing a wavelength measurement.

In some implementations, sensor data representing values of the environmental parameters may be produced by the environmental sensors 506. In some implementations, the sensor data may be used in a calibration process and a wavelength measurement process (e.g., the example processes 800 and 900 described in relation to FIGS. 8 and 9). In some examples, the sensor data may be used to determine the refractive index of the transmission medium (e.g., air) in the interferometer cavities 542A, 542B. As shown in FIGS. 8 and 9, the calibration process and the wavelength measurement process may use the sensor data, the wavelength of the reference laser beam, and the geometric parameters of the interferometer cavities (e.g., the interferometer lengths and the wedge angle) to determine the absolute wavelength of the test laser beam. However, other environmental parameters are possible.

In some implementations, the control system 502 may be used, for example, to operate the optical switch 516 in the optical system 504 to switch between receiving the different laser input sources. In some implementations, the control system 502 receives data for signal processing. For example, the control system 502 may communicate with the camera system 528 of the optical system 504 to receive interferometric data. For example, the control system 502 may communicate with the environmental sensors 506 to receive the sensor data. In some instances, the control system 502 may be used to implement one or more aspects of the systems and techniques described with respect to FIGS. 8 and 9, or to perform other types of operations.

Figure 6:
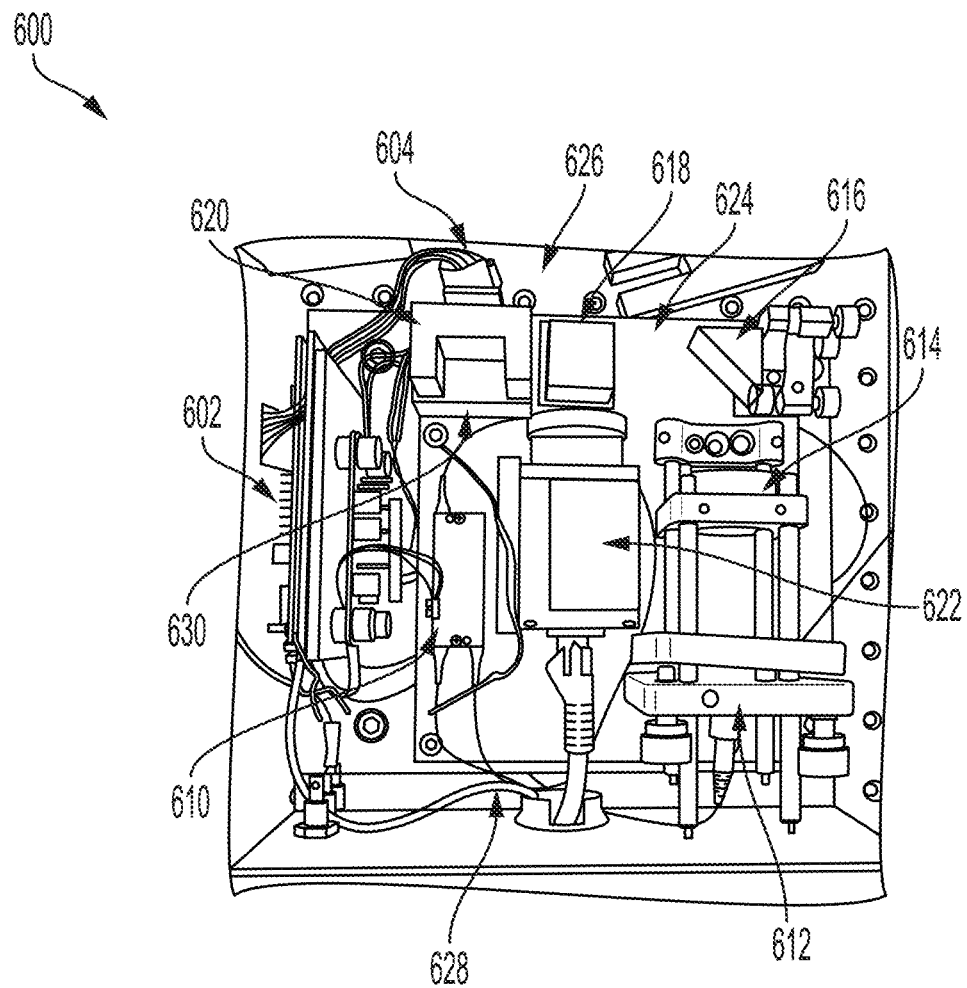
FIG. 6 shows a top-view photograph of a prototype system for wavelength measurement.

FIG. 6 presents a top-view photograph of a prototype system 600 for wavelength measurement. In some instances, the prototype system 600 shown in FIG. 6 may be used for performing a wavelength measurement, e.g., the processes described in relation to FIGS. 8 and 9. In the example shown in FIG. 6, the prototype system 600 includes control electronics 602, environmental sensors 604, and a series of optical elements that defines one or more beam paths between a laser source (not shown) and a camera 622. In the example shown, the series of optical elements includes a MEMS optical fiber switch 610, a fiber coupler 612, a collimating lens 614, a mirror 616, a beam splitter 618, and dual Fizeau interferometers 620. The prototype system 600 may also include a beam stop, which can be the cover (not shown) of the prototype system. In some examples, the prototype system 600 may receive laser beams through optical fibers 628 optically coupled to the MEMS optical fiber switch 610. The laser beams may be generated by the laser sources (not shown). As shown in FIG. 6, a physical footprint of the prototype system 600 is approximately 175 mm×175 mm×100 mm (L x W x H). However, other dimensions are possible.

In some implementations, the series of optical elements are mounted on a base unit 624, which is further mounted on an optical table 626. In these implementations, the control electronics 602 may be located elsewhere (e.g., remotely or not on the base unit 624). In some implementations, a temperature of the base unit 624 may be actively stabilized using a low-power (<1 W) temperature controller (not shown). In some instances, the low-power temperature controller is used to limit a variation in the temperature of the base unit 324 to ±20 mK. In some implementations, the environmental sensors 604 have low power consumption during operation, e.g., about 3 mW. In some implementations, the technique and system disclosed herein are suitable for portable devices where power consumption is a key design constraint.

In the prototype system 600, the dual Fizeau interferometers 620 in a monolithic block 630 are further mounted on the base unit 624 with the low-power temperature controller. In some implementations, a thermal effect to the monolithic block 630 may simultaneously affect geometries of the dual Fizeau interferometers 620. In some instances, the thermal effect to the geometries of the dual Fizeau interferometers 620 may affect interferograms collected on the camera 622, which are used to determine the wavelength of the test laser beam. In some examples, changes in the geometries of the dual Fizeau interferometers 620 may be determined by monitoring the temperature of the interferometers. The temperature readings can be used to correct the wavelength reading.

In the prototype system 600 shown in FIG. 6, the environmental sensors 604 are obtained from Honeywell (BME280); the MEMS optical fiber switch 610 with custom connectors is obtained from Thorlabs (OSW12-830-SM); the camera 622 is obtained from IDS systems (UI-5290SE); and the temperature controller is obtained from Koheron (TEC100L).

Figure 7A:
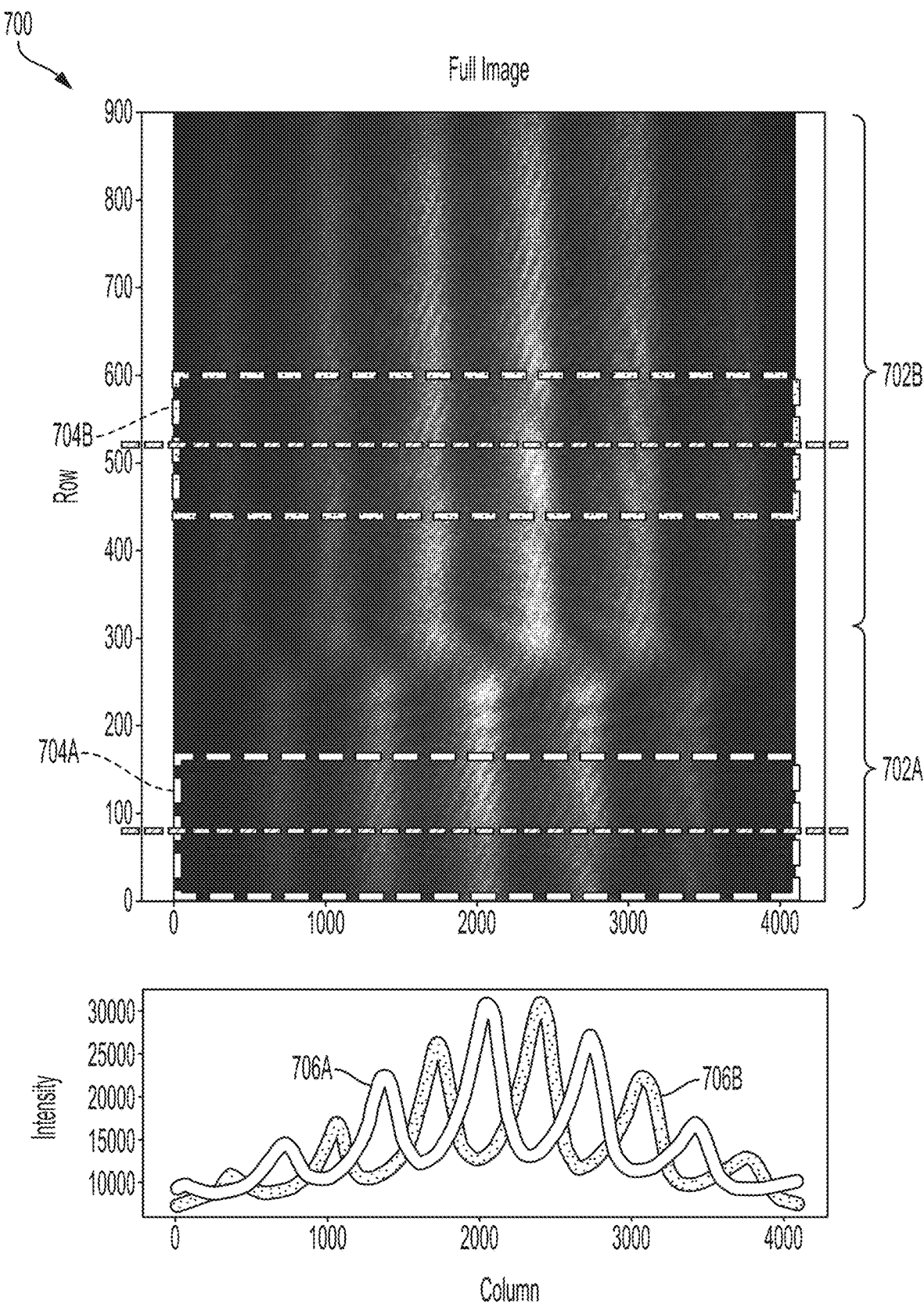
FIG. 7A shows example interferometric data generated by a camera in a prototype system.

FIG. 7A presents a plot 700 showing example interferometric data. As shown in FIG. 7A, the example interferometric data is produced using a wavelength measurement system, e.g., one of the systems 500, 600 shown in FIGS. 5A-6. In some instances, two interferograms 702A, 702B from two interferometer cavities (e.g., the interferometer cavities 542A, 542B shown in FIG. 5A) in the full spatial intensity profile are spatially separated and captured by a camera (e.g., one of the camera systems 528, 622 as shown in FIGS. 5A-6). In some implementations, the camera may include a 2-dimensional (2D) array of image sensors, each of which may be a Charge Coupled Device (CCD) sensor and a complementary metal-oxide semiconductor (CMOS) sensor. For example, a first interferogram 702A may be captured by first rows of pixels (e.g., between row 0 and row 180) of the camera and a second interferogram 702B may be captured by second rows of pixels (between row 420 and row 600) of the camera. In some instances, a subset of rows in each of the interferograms is used for determining interference fringes of the corresponding interferograms. As shown in FIG. 7A, a summation of intensity values at pixels in the same column of a first subset of rows 704A (e.g., between row 0 and row 180) is used to determine a first intensity curve 706A of the first interferogram 702A. Similarly, a summation of intensity values at pixels in the same column of a second subset of rows 704B (e.g., between row 420 and row 600) is used to determine a second intensity curve 706B of the second interferogram 702B. In some instances, the camera may include two line-sensor arrays oriented in the same direction and separated by a distance so as to capture the two spatially separated interferograms 702A, 702B.

Figure 7B:
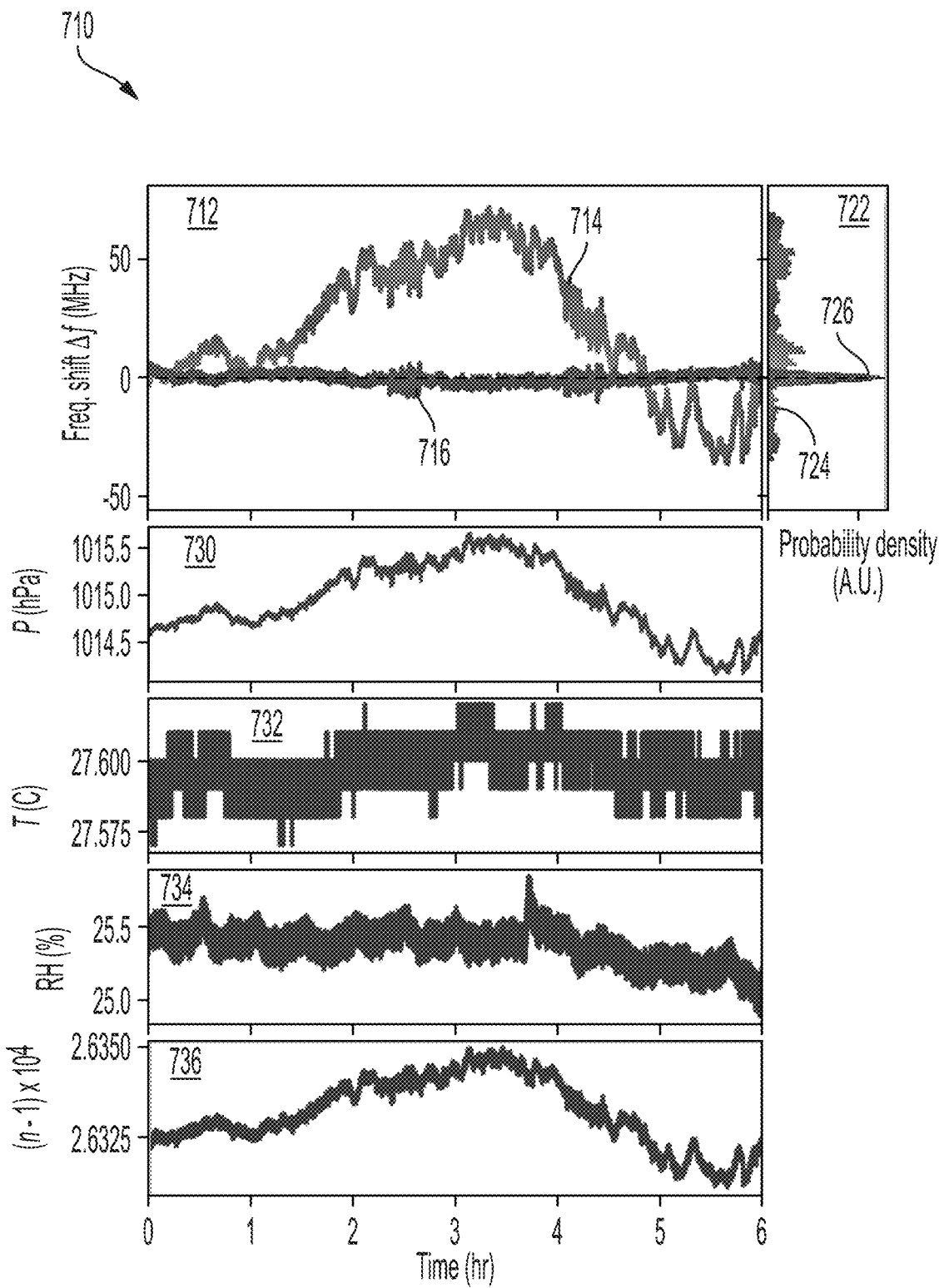
FIG. 7B is a plot showing measured frequencies before and after compensation for environmental influences.

FIG. 7B presents a plot 710 showing measured frequencies before and after compensation for environmental influences. As shown in FIG. 7B, frequency measurements are performed using a wavelength measurement system, e.g., the prototype system 600 shown in FIG. 6. As shown in FIG. 7B, the plot 710 contains six panels, including a first panel 712 showing frequency shift values ($\Delta f$) over a time period (6 hours), a second panel 722 showing probability densities over a range of the frequency shift values ($\Delta f$), a third panel 730 showing pressure values over the same time period, a fourth panel 732 showing temperature values over the same time period, a fifth panel 734 showing relative humidity over the same time period, and a sixth panel 736 showing calculated refractive index according to the measured environmental parameters shown in the third, fourth, and fifth panels 730, 732, and 734. The plot 710 may be obtained by performing a wavelength measurement process, e.g., the example process 900 described in FIG. 9.

In some instances, a laser source is used to provide a laser beam with a wavelength of 1018.62 nm and an optical frequency of 294.52 THz to an optical system through optical fibers, e.g., the optical fibers 628 of FIG. 6. The laser source is stabilized over the entire measurement period and locked to an ultra-stable optical cavity, with a wavelength variation less than 0.2 fm, e.g., equivalent to a frequency variation less than 100 kHz, which is much less than the measurement precision that can be provided by the prototype system 600.

In some instances, the curve 714 in the first panel 712 of FIG. 7B shows the frequency shift ($\Delta f$) before compensation for the environmental influences on the refractive index. In some instances, the refractive index of the air at the wavelength of the laser beam of 1018.62 nm is fixed at a value determined by the initial environmental conditions. As shown in the curve 714 and corresponding histogram 724, the frequency shift ($\Delta f$) values before compensation vary widely between +70 MHz and −35 MHz.

In some implementations, the compensation is performed based on data of environmental parameters collected by environmental sensors during the same period of time as shown in subpanels 730, 732, and 734. As shown in the third subpanel 730, the pressure increases from 1014.5 to 1015.5 hPa during the time period between hour 1 and hour 3 and reduces between hour 3 and hour 5 and eventually to a value below 1014.5 hPa at hour 5. The temperature and relative humidity remain constant with visible fluctuations and random noise in the signal as shown in the fourth and fifth subpanels 732, 734.

The data of the environmental parameters is used to correct the refractive index value. The calculated refractive index value as a function of time (shown in the sixth subpanel 736) exhibits a similar shape with a generally consistent behavior over time as the pressure shown in the third subpanel 730. As shown in curve 716 in the first panel 712 of FIG. 7B, after correcting the refractive index, the frequency shift ($\Delta f$) values are reduced to a range between −5 MHz and +5 MHz with a standard deviation of <2 MHz. As shown in a corresponding histogram 726 in the second panel 724 of FIG. 7B, the probability density of the frequency shift ($\Delta f$) values after the compensation exhibits an approximate Gaussian nature with a bandwidth of <2 MHz, which is equivalent to a variation of 6 parts in $10^9$ of the frequency. In some implementations, the methods and techniques presented here can effectively remove the environmental influences on the wavelength measurement without conducting a recalibration process.

FIG. 8 presents a flow chart showing an example process 800 for calibrating a wavelength measurement system. The example process 800 can be performed, for example, by a wavelength measurement system and reference laser with a known frequency. For instance, operations in the process 800 may be performed or implemented using the components in the wavelength measurement systems 400, 500, and 600 shown in FIGS. 4-6, or another type of system. The example process 800 may include additional or different operations, including operations performed by additional or different components, and the operations may be performed in the order shown or in another order.

In some implementations, the example process 800 may be performed during initial setup of a wavelength measurement system. In some implementations, the process 800 may be performed for re-calibration purposes when a substantial reconfiguration to the wavelength measurement system is made, e.g., after an optical re-alignment. In some implementations, the example process 800 may be used to determine at least one interferometer length of at least one interferometer of the wavelength measurement system. The example process 800 may also be used to determine Gaussian envelope parameters or another parameter. In some examples, the at least one interferometer length and the Gaussian envelope parameters may be used in a wavelength measurement process (e.g., the process 900 described in relation to FIG. 9) to determine a wavelength of a test laser beam.

At 802, information of a reference laser beam is provided. In some implementations, the information including, for example, a wavelength, a frequency, or other parameters of the reference laser beam, may be provided by inputting the information into a control system. For example, the information with a high accuracy and precision may be input to the control system through an input device and stored in a memory of the control system. In some instances, the wavelength of the reference laser beam may be provided by the manufacturer, determined by a theoretical calculation, or in another manner. In some implementations, the reference laser beam may be only used at 802 of the example process 800. The techniques and systems disclosed here do not require a permanent reference laser for intermittent re-calibration to compensate for the long-term drift. In some instances, multiple reference laser beams with different frequencies may be used.

At 804, approximate interferometer lengths are measured. In some implementations, the approximate interferometer lengths of an interferometer may be measured using a mechanical method, e.g., a micrometer gauge. In some examples, the micrometer can provide an accuracy of ±10 micrometers (μm). In some examples, the interferometer is implemented as the dual Fizeau interferometers 526 shown in FIGS. 5A-5B or in another manner. In some instances, the approximate interferometer lengths may be measured at two opposing ends of the dual Fizeau interferometers 526 or anywhere along the interferometer cavities. In some instances, the difference between the interferometer lengths measured at the two opposing ends, which is less than 10 micrometers, is caused by the angled second glass piece 540B. In some implementations, the interferometer lengths measured here are used as a reference value to constrain fitted values in the example process 800. In some instances, the step 544 has a height of 390 μm.

At 806, data from an optical system and environmental sensors is received. The optical system may include a camera (or camera system) and two lasers configured to generate respective laser beams. In some implementations, the camera may be configured at an output of a beam splitter (e.g., as shown in FIGS. 5A and 6), which combines the two laser beams creating one or more interferograms. In some implementations, the data produced by the camera upon detecting the one or more interferograms includes interferometric data. In some examples, the environmental sensors are configured in proximity to the interferometer to measure environmental parameters in cavities of the interferometer. In some instances, the environmental sensors may be implemented as the environmental sensors as shown in FIGS. 5A and 6 or in another manner. In some examples, data received from the environmental sensors may include sensor data representing values of the environmental parameters in the transmission medium, including at least one of a temperature, a pressure, a humidity, and a $CO_2$ concentration level. In some implementations, the sensor data is received by the control system and stored in the memory, which may be implemented as the control system 502, 602 as shown in FIGS. 5A and 6 or in another manner.

At 808, a refractive index of the transmission medium in the interferometer is computed. In some implementations, the sensor data received from the environmental sensors may be used to determine the refractive index of the transmission medium (e.g., air) in the cavities of the interferometer. In some instances, the refractive index may be a function of the temperature, pressure, humidity, and wavelength of the reference laser beam. In some instances, the refractive index may be also a function of the $CO_2$ concentration level in the transmission medium. In some implementations, the refractive index is determined by the control system according to a refractive index calculation algorithm. In some examples, the refractive index calculation algorithm may be performed by executing programs stored in the memory of the control system. In some instances, the refractive index may be used to determine an optical path length, which is a product of the interferometer length and the refractive index.

At 810, the interferometer lengths are fitted. In some implementations, the interferometer lengths are determined by fitting a reflected intensity model to the interferometric data received by the camera. For example, the reflected intensity model may be implemented as the reflected intensity model 1000A-1000C described in relation to FIGS. 10A-10C or in another manner. In some instances, the interferometric data may include parameters such as a phase difference, and a reflected electric field amplitude for the reflected laser beam at internal surfaces of the interferometer (e.g., the zeroth, first and second order reflections described in relation to FIGS. 10A-10C). The geometric parameters of the reflected intensity model may be determined using the known wavelength of the reference laser beam and the sensor data received from the environmental sensors. In some implementations, the fitted interferometer lengths are compared to the measured interferometer lengths at 804. In some implementations, the interferometer lengths are fitted with a least-squares minimization algorithm. In some examples, the least-square minimization algorithm may use a minimum chi-square method by minimizing a Chi-square function.

At 812, Gaussian envelope parameters of the reference laser beam are fitted. In some implementations, the Gaussian envelope parameters may be determined by fitting the reflected intensity model to the interferometric data received from the camera. For example, the Gaussian envelope parameters may be determined according to the refractive index, the fitted interferometer lengths, and the wavelength of the reference laser beam.

FIG. 9 presents a flow chart showing an example process 900 for performing a wavelength measurement. The example process 900 can be performed, for example, by a wavelength measurement system. For instance, operations in the example process 900 may be performed or implemented using the components in the wavelength measurement systems 400, 500, and 600 shown in FIGS. 4-6, or another type of system. The example process 900 may include additional or different operations, including operations performed by additional or different components, and the operations may be performed in the order shown or in another order.

In some implementations, the example process 900 is performed after a calibration process. In some instances, the calibration process may be implemented as the example process 800 described in relation to FIG. 8 or in another manner. In some implementations, prior to performing the example process 900, a test laser beam may be directed to the wavelength measurement system (e.g., the wavelength measurement system 500, 600 as described in relation to FIGS. 5A and 6, respectively).

At 902, data from the optical system and environmental sensors is received. In some implementations, the optical system and the environmental sensors may be configured as shown in FIGS. 5A and 6 or in another manner. In some examples, operation 902 may be implemented as operation 806 in FIG. 8 or in another manner.

At 904, a refractive index of a transmission medium in an interferometer is computed. In some examples, operation 904 may be implemented as operation 808 in FIG. 8 or in another manner. In some instances, the refractive index may be determined using an initial guess value of a wavelength of the test laser beam. In some implementations, the initial guess value of the wavelength of the test laser beam may be inferred from the number of fringes in the interferometric data received from a camera system of the optical system, may be obtained from a previous measurement result or in another manner.

At 906, a first value of the wavelength of the test laser beam is determined using a local optimization model. In some implementations, the interferometric data received from the camera system is fitted according to a reflected intensity model, such as the reflected intensity model 1000A-1000C described in relation to FIGS. 10A-10C. A reflected intensity model may be represented by a function, $f$, that is based on multiple variables, as shown below:

$$f(y,\gamma,T,P,H,C_{CO_2},\alpha,e_1,y_{c1},\sigma_1,O_1,e_2,y_{c2},\sigma_2,O_2) \qquad (27)$$

In Equation (27), y is the y-axis position or pixel position on the camera or linear array, $\lambda$ is the wavelength, T is the temperature, P is the pressure, H is the humidity, $C_{CO_2}$ is the $CO_2$ concentration, $\alpha$ is the wedge angle, $e_1$ is the first interferometer length, $(y_{c1}, \sigma_1, O_1)$ are first Gaussian envelope parameters of a first interferometer cavity, $e_2$ is the second interferometer length, and $(y_{c2}, \sigma_2, O_2)$ are second Gaussian envelope parameters of a second interferometer cavity. In some implementations, the wedge angle $\alpha$, which is common to both interferometers in the dual Fizeau interferometers 526 as shown in FIGS. 5A and 5B, may be determined using a mechanical measurement method. In some instances, the interferometer lengths and Gaussian envelope parameters are determined during a calibration process described in relation to FIG. 8, or in another manner. In some instances, the environmental parameters T, P, RH, and $C_{CO_2}$ are determined according to the data from the environmental sensors.

In some implementations, the local optimization mode may be based on a least-squares minimization algorithm. In some examples, the least-square minimization algorithm may use a minimum chi-square method by minimizing a Chi-square function locally, which is defined as:

$$\chi^2 = \sum_i (f(y_i, \lambda) - D_i)^2 \qquad (28)$$

where $f(y_i,\lambda)$ is the reflected intensity model at a y-axis position and a wavelength and $D_i$ is actual intensity in the interferograms captured by the camera at the same y-axis position. Equation (28) is used to fit the wavelength using information from both interferometers with all other parameters fixed. In some instances, since the actual intensities in the interferograms are periodic with respect to integer multiples of the wavelength, the chi-square value ($\chi^2$) is also periodic with respect to integer multiples of the wavelength with multiple local minima separated in wavelength by the cavity-free spectral range. In some instances, the cavity-free spectral range is a spacing in terms of wavelength or optical frequency between successive minima in the interferogram. In some instances, the cavity-free spectral range is a function of the speed of light and the interferometer length. In some instances, the first value of the wavelength is the wavelength value at a local minimum of the chi-square value.

At 908, a second value of the wavelength of the test laser beam is determined using a global optimization model. In some instances, the second value of the wavelength is the wavelength value at the global minimum of the chi-square value. In some instances, the global optimization model is used to determine the global minimum using the local minimum and the cavity-free spectral range separating adjacent local minima. In some instances, by varying the wavelength according to the cavity-free spectral range, the method allows a "hopping" between local minima to further reduce the chi-square value in order to efficiently search for the global minimum. In some instances, the global optimization model can provide a fast, accurate, and reliable approach to determine the true value of the wavelength. In some implementations, the dual Fizeau interferometers with two different interferometer lengths may provide reliable and efficient fitting of the wavelengths. For example, local minima corresponding to the two different interferometer lengths are separated by integers of the cavity free-spectral-range. In some implementations, the minimum chi-square method may be performed on two interferograms created from the two corresponding interferometer cavities. In some implementations, the second value of the wavelength obtained during operation 908 may be further used in operation 906 to allow fine-tuning the fitting of the true wavelength of the test laser beam. In some implementations, other methods for fitting the local or global optimization models may be used.

In some implementations, the sensor data can be used along with a thermal expansion model to correct for the thermal expansion of the glass pieces of the interferometer. In some instances, the thermal expansion model may be determined according to the interferometer structure and geometry. In some instances, the thermal expansion model is a linear function of the temperature and can be determined using a laser with a known wavelength. In some instances, the thermal expansion effect is determined prior to the wavelength measurement as shown in FIG. 9.

It will be appreciated that a model (e.g., a reflective intensity model) may be used to represent the optical characteristics of an interferometer. The model may be based on a configuration of the interferometer and may also be used to fit data generated by light traversing the interferometer. Examples of interferometers with distinct configurations include a Michelson interferometer, a Fabry-Perot interferometer, a Twyman-Green interferometer, a Mach-Zehnder, a Sagnac interferometer, and a Fizeau interferometer. Other types of interferometers are possible. The model may serve as part of a process to determine a property of the light (e.g., a wavelength of the light), such as the models described in relation to the example processes 800, 900 of respective FIGS. 8 and 9.

Figure 10A:
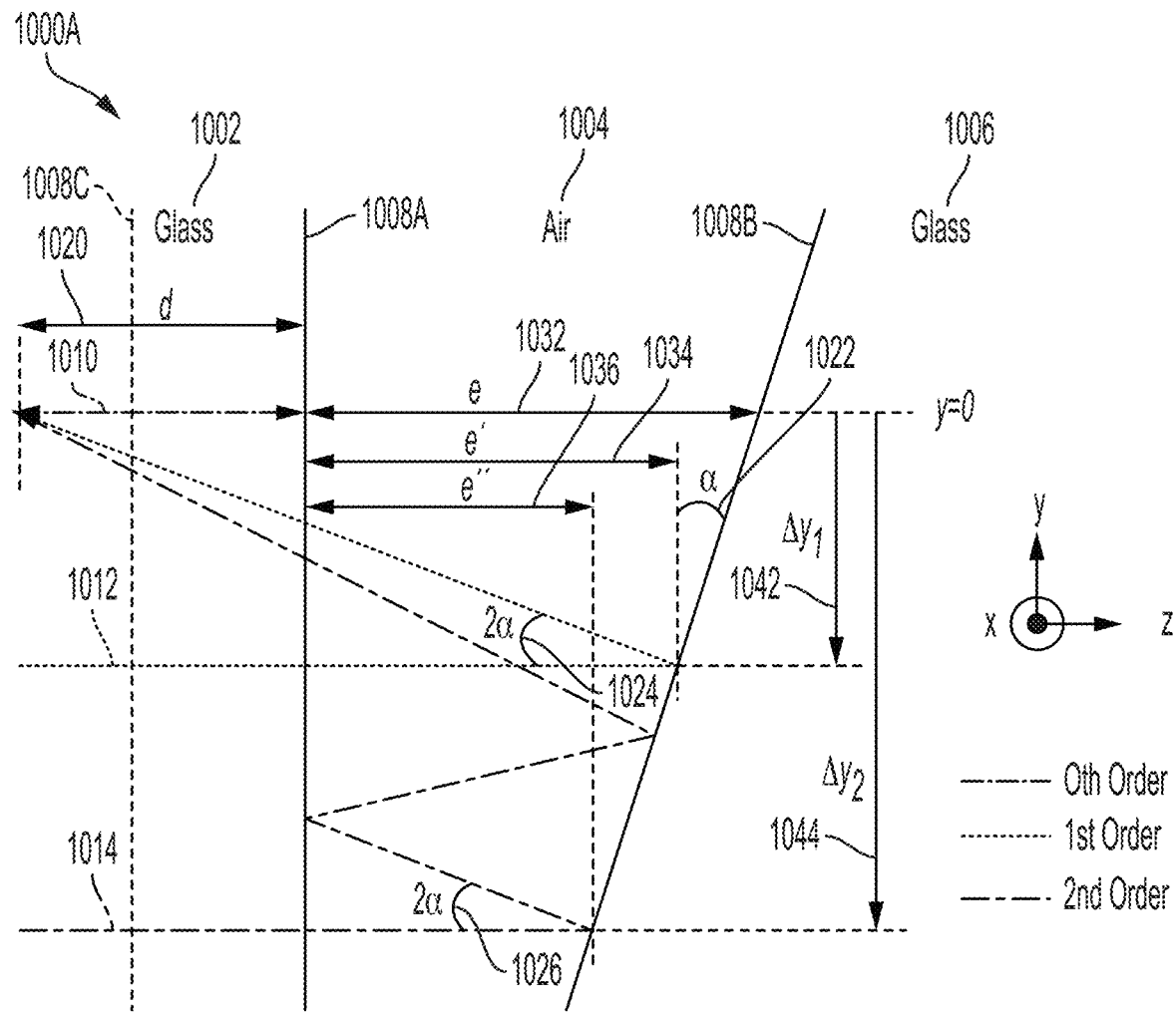
FIGS. 10A-10C are schematic diagrams of a reflected intensity model used in the example processes of respective FIGS. 8 and 9.
Figure 10B:
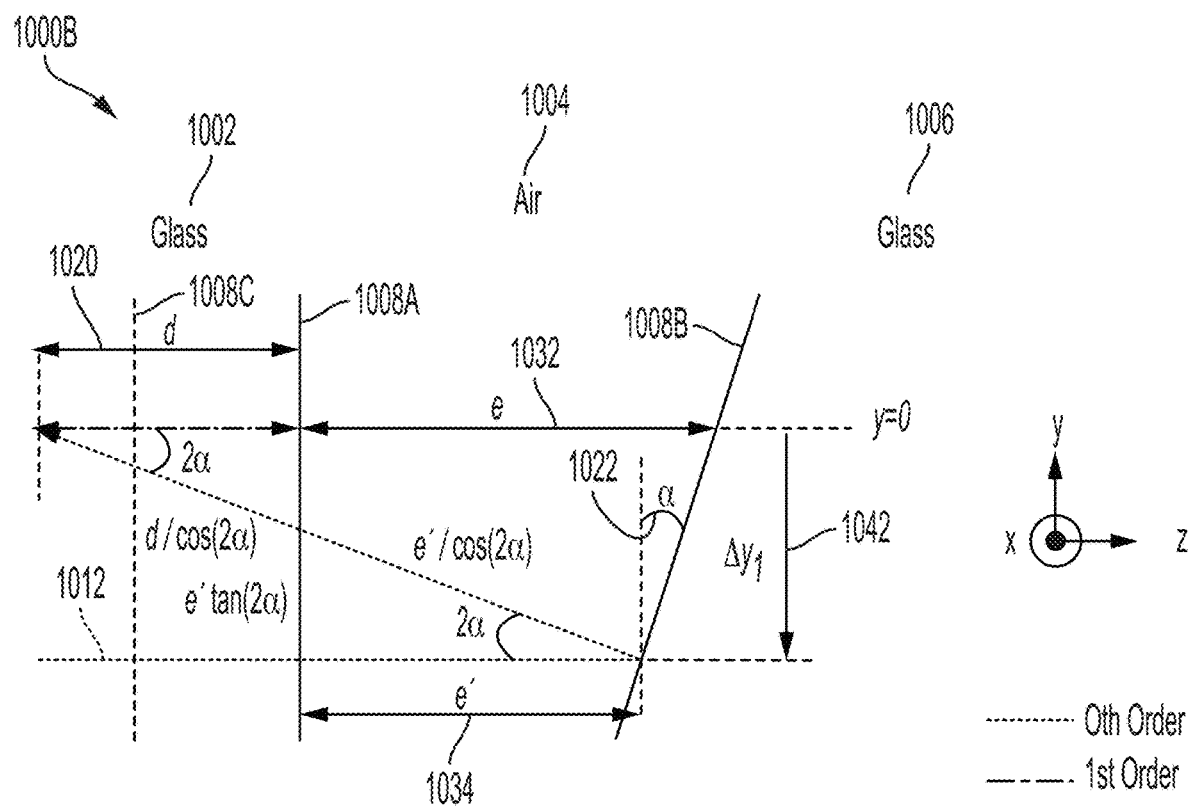
Figure 10C:
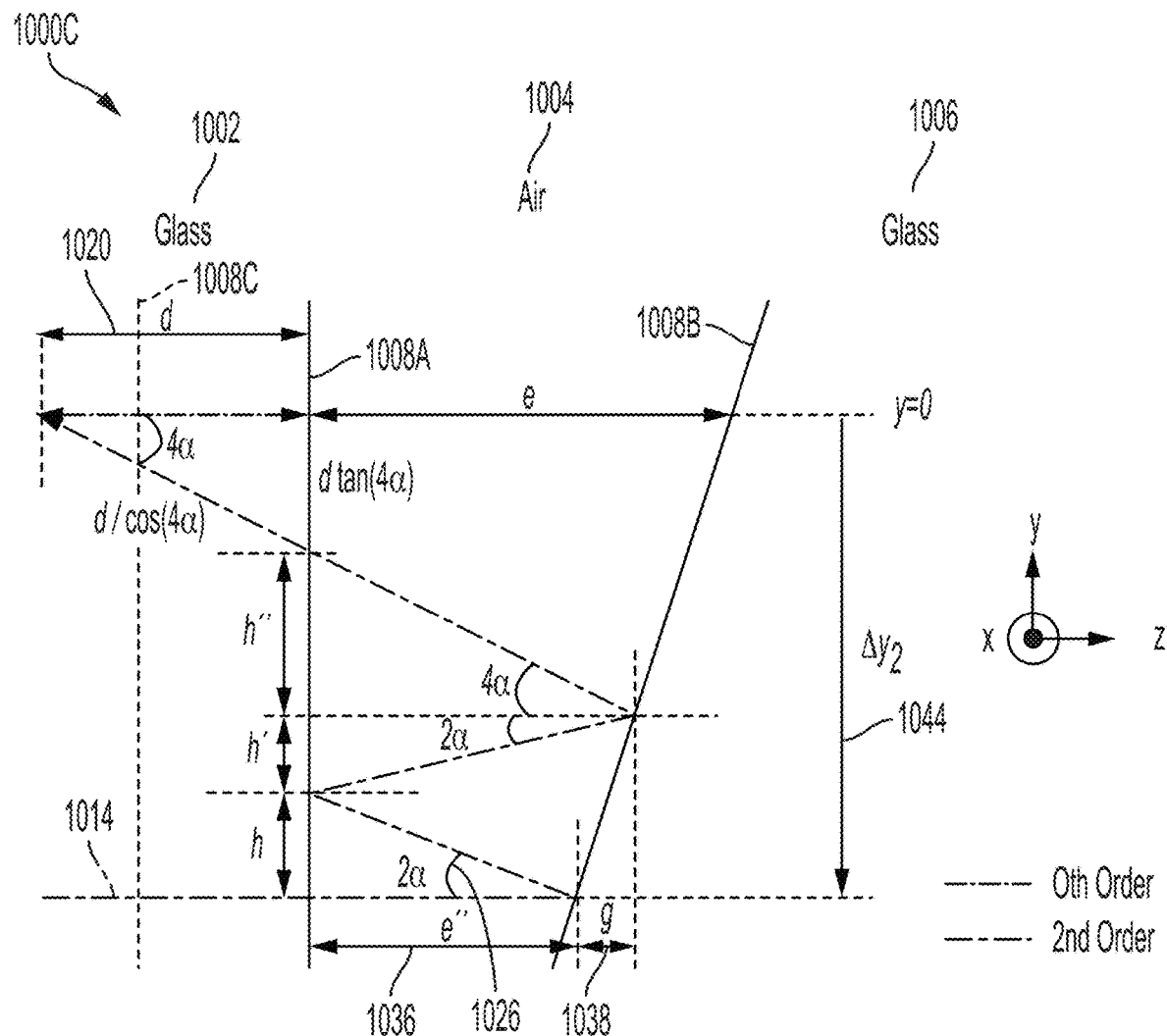

FIGS. 10A-10C present schematic diagrams 1000A-1000C of an example reflected intensity model for a Fizeau interferometer. In some instances, the reflected intensity model in FIGS. 10A-10C is used for wavelength measurement using a wavelength measurement system as shown in FIGS. 4-6. In some instances, a different reflected intensity model may be constructed based on ray optics when a different wavelength measurement system is used, for example when using a different interferometer such as Michelson interferometers, or Fabry-Perot interferometers. In each of the FIGS. 10A-10C, the schematic diagrams 1000A-1000C include reference axes defined by an x axis, a y axis, and a z axis. The x axis is perpendicular to the schematic diagrams, with a positive direction extending into the schematic diagrams. They and z axes define a plane parallel to the schematic diagrams of FIGS. 10A-10C. In the example shown in FIGS. 10A-10C, three rays 1010, 1012, 1014 corresponding to the zeroth, first, and second order reflections at two internal air/glass interfaces in an interferometer are evaluated for purposes of illustration. All other rays with higher order reflections may be determined in the same manner or in a different manner. In some implementations, a similar analysis may be applied on the dual Fizeau interferometers with different interferometer lengths. In some implementations, parameters, such as a path length, a phase difference, and a reflected electric field amplitude of each of the three rays can be determined according to the schematic ray diagram. More elaborate models based on wave optics can also be used to model the interferometer.

In the example shown in FIG. 10A, a ray picture is used to describe a specific example. The interferometer in the example is a Fizeau interferometer such as that shown in FIG. 6, where a first internal surface 1008A and a second internal surface 1008B are coated with Inconel to yield a reflectivity at each surface of 33%. A first external surface 1008C has a broadband dielectric coating to minimize reflections. The reflectivity of the first external surface of the interferometer 620 shown in FIG. 6 is less than 0.5% in a wavelength range between 800 and 1100 nm. All the three rays 1010, 1012, 1014 are received by a detector, e.g., the camera system 528 in the wavelength measurement system 500, relative to the first internal surface 1008A of the interferometer, to create an interferogram. In some implementations, the detector may be located on a detector plane, which is separated from the first internal surface 1008A of the interferometer by a distance, d, 1020. In some instances, the distance, d, 1020 may include the thickness of a first glass piece, the beam splitter and the thickness of a transmission medium between the detector and the first glass piece. The distance d can be characterized as a physical distance with a path dependent index of refraction. The example derivation assumes that the index of refraction of the gap 1004 and d 1020 is air. When α 1022 is small and d 1020 is large the outgoing rays are nearly parallel, and d only leads to small relative phase shifts between the different beams. In general, an infinite number of rays such as 1010, 1012, and 1014 contribute to the interferogram. In many cases, a finite number of rays are sufficient to describe the interferogram. Since each reflection results in some loss, the contribution of each ray decreases with the number of reflections.

In some implementations, evaluations of the reflections of the rays may be simplified according to certain assumptions. For example, a reflection loss at the first external surface 1008C may be ignored by depositing an antireflection coating. In some examples, these assumptions may lead to a small shift in quantities such as the optical path length differences of the laser beams used to calculate the interferogram. For example, the first glass piece adds a nearly constant phase difference to all the reflected laser beams, which acts as an offset to the value of d 1020 used.

In some implementations, an incoming laser beam may be a plane wave, traveling in the $+\vec{z}$ direction and the three rays 1010, 1012, 1014 may have no initial phase difference before reaching the first internal surface 1008A. In some examples, the first internal surface 1008A is located on the x-y plane and the second internal surface 1008B is angled in the x-y plane at a wedge angle α 1022 to the $\vec{y}$ axis.

In the example shown in FIG. 10A, a reflectivity of the first and second internal surfaces 1008A, 1008B is expressed as:

$$R = (n(\lambda)^2 - n_{air}(\lambda, T, P, RH, C_{CO_2}))/(n(\lambda)^2 + n_{air}(\lambda, T, P, RH, C_{CO_2})),\quad (29)$$

where R is the reflectivity at the interface, n is the wavelength-dependent refractive index of the mirrors, $n_{air}(\lambda, T, P, RH, C_{CO_2})$ is the environmentally dependent index of refraction of the air in the gap between the interferometer mirrors, and λ is the wavelength. In some examples, an electric field reflection coefficient, r, is defined by $r=\sqrt{R}$, and corresponding transmission coefficient, t, is defined by $t=1-r$.

In some implementations, a path length of the first ray 1010 corresponding to the zeroth order reflection from the first internal surface 1008A is equal to the distance d 1020 and the reflected electric field of the first ray 1010 is expressed as:

$$E_0 = rE_{in} \cdot \exp\left(\frac{i2\pi n f}{c}d\right), \quad (30)$$

where $E_0$ is the reflected electric field of the zeroth order reflection (e.g., the first ray 1010), $E_{in}$ is the incident electric field, $f$ is the optical frequency, n is the index of refraction of the medium d assumed to be the same as that between the reflective surfaces of the interferometer and c is the speed of light.

According to the example diagram 1000B of the second ray 1012 shown in FIG. 10B, a distance e' 1034 along the $\vec{z}$ axis between the first internal surface 1008A and a point where the second ray 1012 reflects on the second internal surface 1008B may be expressed as:

$$e' = e - \Delta y_1 \tan(\alpha) = \frac{e - d\tan(\alpha)\tan(2\alpha)}{1 + \tan(\alpha)\tan(2\alpha)}. \quad (31)$$

A distance $\Delta y_1$ 1042 along the $\vec{y}$ axis corresponding to the point where second ray 1012 reflects on the second internal surface 1008B in order to interfere with the first ray 1010 at a point on the camera may be expressed as:

$$\Delta y_1 = (d + e')\tan(2\alpha) = (d + e)\frac{\tan(2\alpha)}{1 + \tan(\alpha)\tan(2\alpha)}. \quad (32)$$

In the example shown in FIG. 10B, the total path length $l_1$ for the second ray 1012 may be determined as:

$$\ell_1 = e' + \frac{d + e'}{\cos(2\alpha)}. \quad (33)$$

Note that e' can be written in terms of e, the spacing between the reflective surfaces of the Fizeau interferometer at the point of incidence of the second ray 1012, α and d using Equation (31).

The reflected electric field $E_1$ of the second ray 1012 may be determined as:

$$E_1 = rt^2 E_{in} \cdot \exp\left(\frac{i2\pi n f}{c}\ell_1 + \pi\right), \quad (34)$$

where $E_1$ is the reflected electric field of the first order reflection (e.g., the second ray 1012), and an extra π phase difference is introduced to the second ray 1012 as a result of the single internal reflection at the second internal surface 1008B, assumed to be an interface where the ray is incident from the side of lower index of refraction, leading to a π phase shift of the ray as it is reflected. The assumption is consistent with 1004 as an air gap and the first and second glass pieces 1002, 1006 with Inconel-coated surfaces (e.g., the first and second internal surfaces 1008A, 1008B), having greater index of refraction than the air.

According to the example ray diagram of the third ray 1014 shown in FIG. 10C, a distance e" 1036 along the $\vec{z}$ axis between the first internal surface 1008A and a first point where the third ray 1014 reflects on the second internal surface 1008B may be expressed as:

$$z = e'' + g \quad (35)$$

Here, g 1038 is the distance traversed along the $\vec{z}$ axis between the first reflection point and a second reflection point on surface 1008B of the third ray 1014 that combines with the first and second rays 1010, 1012.

Defining z=0 to be at the first internal surface 1008A and substituting 2α and 4α for, respectively, α and 2α in Equation (31) gives:

$$z = \frac{e - d\tan(2\alpha)\tan(4\alpha)}{1 + \tan(2\alpha)\tan(4\alpha)} \quad (36)$$

Finding a simultaneous equation with z and e″ results in:

$$e'' + e'' \tan(2\alpha)\tan(\alpha) = z - z \tan(2\alpha)\tan(\alpha) \quad (37)$$

Equation (36) may be used to substitute for z in Equation (37) and subsequent rearrangement yields:

$$e'' = \left(\frac{1 - \tan(\alpha)\tan(2\alpha)}{1 + \tan(\alpha)\tan(2\alpha)}\right)\left(\frac{e - d\tan(2\alpha)\tan(4\alpha)}{1 + \tan(2\alpha)\tan(4\alpha)}\right) \quad (36)$$

the total path length $l_2$ of the third ray 1014 may be determined as:

$$\ell_2 = e'' + \frac{e''}{\cos(2\alpha)} + \frac{z}{\cos(2\alpha)} + \frac{z}{\cos(4\alpha)} + \frac{d}{\cos(4\alpha)}. \quad (37)$$

The field $E_2$ of the second order reflection (e.g., the third ray 1014) is:

$$E_2 = r^3 t^2 E_{in} \cdot \exp\left(\frac{i2\pi n f}{c}\ell_2 + 3\pi\right), \quad (38)$$

where an extra 3π phase difference is introduced to the third ray 1014 as a result of the triple internal reflection at the first and second internal surfaces 1008A, 1008B.

In some implementations, an interferogram may be determined as shown by Equation (39):

$$I_R = |E_0 + E_1 + E_2|^2, \quad (39)$$

In Equation (39), $I_R$ can be expressed in terms of e, d, α, n, and λ or f. In some instances, λ can be determined by the geometry of the interferometer (e.g., e, d, and α) and the index of refraction n using the reflected intensity, $I_R$.

In some implementations, a total reflected intensity across the entire beam may be determined by replacing e in the above equations with e+y tan(α), where y is an array of points representing each pixel in the detector, and multiplying the whole array by a Gaussian envelope function, $$I_{detected}(y) = I_R(y) \cdot \exp\left(-\frac{(y - y_c)^2}{2\sigma^2}\right) + 0, \quad (40)$$

where $y_c$, σ and O are Gaussian envelope parameters. For example, $y_c$, σ and O are respectively, the center, 1/e width and offset (background level) of the Gaussian signal that is detected on the detector.

Although FIGS. 10A-10C are presented in the context of a Fizeau interferometer, it will be understood that other types of interferometers may serve as a basis for determining a reflective intensity model. For example, a Michelson interferometer, a Fabry-Perot interferometer, a Twyman-Green interferometer, a Mach-Zehnder, a Sagnac interferometer, a Fizeau interferometer, or some other type of interferometer may serve as a basis for generating the reflective intensity model. Moreover, methods other than optical ray analysis may be used to develop the reflective intensity model.

In some aspects of what is described, a method for increasing the measurement precision of an optical instrument may be described by the following examples:

Example 1. A method for increasing the measurement precision of an optical instrument, the method comprising:
  determining, based on optical data and environmental data, a measured value of an optical property measured by the optical instrument, wherein:
    the optical instrument comprises:
      an optical path having two reflective surfaces and a transmission medium therebetween, the two reflective surfaces separated by a distance, the transmission medium having an index of refraction, and
      a sensor configured to measure an environmental parameter that influences a magnitude of one or both of the distance and the index of refraction,
    the optical data is generated by the optical instrument in response to an optical signal traversing the optical path, and
    the environmental data is generated by the sensor measuring the environmental parameter;
  determining a predicted value of the optical property based on a model representing time evolution of the optical instrument; and
  by operation of one or more processors, calculating an effective value of the optical property based on:
    the measured value,
    the predicted value, and
    a Kalman gain based on respective uncertainties in the measured and predicted values, the Kalman gain defining a relative weighting of the measured and predicted values in the effective value.

Example 2. The method of example 1,
  wherein the Kalman gain is biased towards the measured value when the uncertainty in the measured value is less than the uncertainty in the predicted value; and
  wherein the Kalman gain is biased towards the predicted value when the uncertainty in the predicted value is less than the uncertainty in the measured value.

Example 3. The method of example 1 or example 2, wherein the model comprises:
  state variables comprising a first state variable representing the optical property and a second state variable representing the environmental parameter, and
  a state vector comprising respective state values for the state variables;
  wherein the time evolution occurs from a previous period to a current period; and
  wherein the method comprises:
    determining the Kalman gain based on a measurement noise matrix, a process noise matrix, and a covariance matrix, wherein:
      the measurement noise matrix comprises values representing an uncertainty in the optical and environmental data,
      the process noise matrix comprises values representing an uncertainty in the model, and
      the covariance matrix comprises values representing an uncertainty in the state values.

Example 4. The method of example 3, comprising:
  repeating, over multiple iterations of respective periods, the operations of determining the measured value, determining the predicted value, determining the Kalman gain, and calculating the effective value; and wherein the values of the measurement noise matrix, the process noise matrix, the covariance matrix, or any combination thereof, are updated for each iteration.

Example 5. The method of example 1 or any one of examples 2-4,
wherein the model comprises:
state variables comprising a first state variable representing the optical property and a second state variable representing the environmental parameter,
a state vector comprising respective state values for the state variables, and
a state evolution function defining a change in the state values from a first set of state values associated with a previous period to a second set of state values associated with a current period; and
wherein the time evolution occurs from the previous period to the current period; and
wherein determining the predicted value comprises:
applying the state evolution function to the first set of state values to generate the second set of state values, a value of the second set of state values for the first state variable being the predicted value.

Example 6. The method of example 5, wherein the state evolution function comprises a plurality of sigma points and respective weighting factors.

Example 7. The method of example 5 or example 6,
wherein determining the measured value comprises:
obtaining measurement values for respective measurement variables of a measurement vector, wherein:
the measurement variables comprise a first measurement variable representing the optical property and a second measurement variable representing the environmental parameter, and
the measurement value obtained for the first measurement variable is the measured value; and
wherein calculating the effective value comprises:
calculating residual values of a residual vector based on a difference between the measurement values and the second set of state values, and
determining a third set of state values for the state vector based on the second set of state values, the Kalman gain, and the residual values, the third set of state values comprising the effective value.

Example 8. The method of example 7,
wherein the measurement variables define a measurement domain for the measurement vector and the state variables define a state domain for the state vector; and
wherein calculating the residual values comprises:
applying a measurement function to the second set of state values to generate a converted second set of state values, the measurement function defining a change in the state values upon conversion from the state domain to the measurement domain; and
subtracting the converted second set of state values from the measurement values to calculate the residual values of the residual vector.

Example 9. The method of example 1 or any one of examples 2-8, wherein the environmental parameter comprises a temperature of the transmission medium, a pressure of the transmission medium, a humidity of the transmission medium, or a concentration of carbon dioxide in the transmission medium.

Example 10. The method of example 1 or any one of examples 2-8, wherein the environmental parameter comprises a temperature of the transmission medium or a length of a spacer separating the two reflective surfaces.

Example 11. A system comprising:
an optical instrument, configured to measure an optical property and comprising:
an optical path having two reflective surfaces and a transmission medium therebetween, the two reflective surfaces separated by a distance, the transmission medium having an index of refraction, and
a sensor configured to measure an environmental parameter that influences a magnitude of one or both of the distance and the index of refraction;
a control system configured to perform operations comprising:
determining, based on optical data and environmental data, a measured value of the optical property, wherein:
the optical data is generated by the optical instrument in response to an optical signal traversing the optical path, and
the environmental data is generated by the sensor measuring the environmental parameter;
determining a predicted value of the optical property based on a model representing time evolution of the optical instrument; and
calculating an effective value of the optical property based on:
the measured value,
the predicted value, and
a Kalman gain based on respective uncertainties in the measured and predicted values, the Kalman gain defining a relative weighting of the measured and predicted values in the effective value.

Example 12. The system of example 11,
wherein the Kalman gain is biased towards the measured value when the uncertainty in the measured value is less than the uncertainty in the predicted value; and
wherein the Kalman gain is biased towards the predicted value when the uncertainty in the predicted value is less than the uncertainty in the measured value.

Example 13. The system of example 11 or example 12,
wherein the model comprises:
state variables comprising a first state variable representing the optical property and a second state variable representing the environmental parameter, and
a state vector comprising respective state values for the state variables;
wherein the time evolution occurs from a previous period to a current period; and
wherein the operations comprise:
determining the Kalman gain based on a measurement noise matrix, a process noise matrix, and a covariance matrix, wherein:
the measurement noise matrix comprises values representing an uncertainty in the optical and environmental data,
the process noise matrix comprises values representing an uncertainty in the model, and
the covariance matrix comprises values representing an uncertainty in the state values.

Example 14. The system of example 13, wherein the operations comprise:
repeating, over multiple iterations of respective periods, the operations of determining the measured value, determining the predicted value, determining the Kalman gain, and calculating the effective value; and wherein the values of the measurement noise matrix, the process noise matrix, the covariance matrix, or any combination thereof, are updated for each iteration.

Example 15. The system of example 11 or any one of examples 12-14,
wherein the model comprises:
state variables comprising a first state variable representing the optical property and a second state variable representing the environmental parameter,
a state vector comprising respective state values for the state variables, and
a state evolution function defining a change in the state values from a first set of state values associated with a previous period to a second set of state values associated with a current period; and
wherein the time evolution occurs from the previous period to the current period; and
wherein determining the predicted value comprises:
applying the state evolution function to the first set of state values to generate the second set of state values, a value of the second set of state values for the first state variable being the predicted value.

Example 16. The system of example 15, wherein the state evolution function comprises a plurality of sigma points and respective weighting factors.

Example 17. The system of example 15 or example 16,
wherein determining the measured value comprises:
obtaining measurement values for respective measurement variables of a measurement vector, wherein:
the measurement variables comprise a first measurement variable representing the optical property and a second measurement variable representing the environmental parameter, and
the measurement value obtained for the first measurement variable is the measured value; and
wherein calculating the effective value comprises:
calculating residual values of a residual vector based on a difference between the measurement values and the second set of state values, and
determining a third set of state values for the state vector based on the second set of state values, the Kalman gain, and the residual values, the third set of state values comprising the effective value.

Example 18. The system of example 17,
wherein the measurement variables define a measurement domain for the measurement vector and the state variables define a state domain for the state vector; and
wherein calculating the residual values comprises:
applying a measurement function to the second set of state values to generate a converted second set of state values, the measurement function defining a change in the state values upon conversion from the state domain to the measurement domain; and
subtracting the converted second set of state values from the measurement values to calculate the residual values of the residual vector.

Example 19. The system of example 11 or any one of examples 12-18, wherein the environmental parameter comprises a temperature of the transmission medium, a pressure of the transmission medium, a humidity of the transmission medium, or a concentration of carbon dioxide in the transmission medium.

Example 20. The system of example 11 or any one of examples 12-18, wherein the environmental parameter comprises a temperature of the transmission medium or a length of a spacer separating the two reflective surfaces.

Example 21. A non-transitory computer-readable medium comprising instructions that are operable, when executed by one or more processors, to perform operations comprising:
determining, based on optical data and environmental data, a measured value of an optical property measured by an optical instrument, wherein:
the optical instrument comprises:
an optical path having two reflective surfaces and a transmission medium therebetween, and
a sensor configured to measure an environmental parameter of the transmission medium between the two reflective surfaces,
the optical data is generated by the optical instrument in response to an optical signal traversing the optical path, and
the environmental data is generated by the sensor measuring the environmental parameter;
determining a predicted value of the optical property based on a model representing time evolution of the optical instrument; and
calculating an effective value of the optical property based on:
the measured value,
the predicted value, and
a Kalman gain based on respective uncertainties in the measured and predicted values, the Kalman gain defining a relative weighting of the measured and predicted values in the effective value.

Example 22. The non-transitory computer-readable medium of example 21,
wherein the Kalman gain is biased towards the measured value when the uncertainty in the measured value is less than the uncertainty in the predicted value; and
wherein the Kalman gain is biased towards the predicted value when the uncertainty in the predicted value is less than the uncertainty in the measured value.

Example 23. The non-transitory computer-readable medium of example 21 or example 22,
wherein the model comprises:
state variables comprising a first state variable representing the optical property and a second state variable representing the environmental parameter, and
a state vector comprising respective state values for the state variables;
wherein the time evolution occurs from a previous period to a current period; and
wherein the operations comprise:
determining the Kalman gain based on a measurement noise matrix, a process noise matrix, and a covariance matrix, wherein:
the measurement noise matrix comprises values representing an uncertainty in the optical and environmental data,
the process noise matrix comprises values representing an uncertainty in the model, and
the covariance matrix comprises values representing an uncertainty in the state values.

Example 24. The non-transitory computer-readable medium of example 23, wherein the operations comprise:
repeating, over multiple iterations of respective periods, the operations of determining the measured value, determining the predicted value, determining the Kalman gain, and calculating the effective value; and
wherein the values of the measurement noise matrix, the process noise matrix, the covariance matrix, or any combination thereof, are updated for each iteration.

Example 25. The non-transitory computer-readable medium of example 21 or any one of example 22-24,
wherein the model comprises:
state variables comprising a first state variable representing the optical property and a second state variable representing the environmental parameter,
a state vector comprising respective state values for the state variables, and
a state evolution function defining a change in the state values from a first set of state values associated with a previous period to a second set of state values associated with a current period; and
wherein the time evolution occurs from the previous period to the current period; and
wherein determining the predicted value comprises:
applying the state evolution function to the first set of state values to generate the second set of state values, a value of the second set of state values for the first state variable being the predicted value.

Example 26. The non-transitory computer-readable medium of example 25, wherein the state evolution function comprises a plurality of sigma points and respective weighting factors.

Example 27. The non-transitory computer-readable medium of example 25 or example 26,
wherein determining the measured value comprises:
obtaining measurement values for respective measurement variables of a measurement vector, wherein:
the measurement variables comprise a first measurement variable representing the optical property and a second measurement variable representing the environmental parameter, and
the measurement value obtained for the first measurement variable is the measured value; and
wherein calculating the effective value comprises:
calculating residual values of a residual vector based on a difference between the measurement values and the second set of state values, and
determining a third set of state values for the state vector based on the second set of state values, the Kalman gain, and the residual values, the third set of state values comprising the effective value.

Example 28. The non-transitory computer-readable medium of example 27,
wherein the measurement variables define a measurement domain for the measurement vector and the state variables define a state domain for the state vector; and
wherein calculating the residual values comprises:
applying a measurement function to the second set of state values to generate a converted second set of state values, the measurement function defining a change in the state values upon conversion from the state domain to the measurement domain; and
subtracting the converted second set of state values from the measurement values to calculate the residual values of the residual vector.

Example 29. The non-transitory computer-readable medium of example 21 or any one of example 22-28, wherein the environmental parameter comprises a temperature of the transmission medium, a pressure of the transmission medium, a humidity of the transmission medium, or a concentration of carbon dioxide in the transmission medium.

Example 30. The non-transitory computer-readable medium of example 21 or any one of example 22-28, wherein the environmental parameter comprises a temperature of the transmission medium or a length of a spacer separating the two reflective surfaces.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:
1. A method for increasing the measurement precision of an optical instrument, the method comprising:
determining, based on optical data and environmental data, a measured value of an optical property measured by the optical instrument, wherein:
the optical instrument comprises:
an optical path having two reflective surfaces and a transmission medium therebetween, the two reflective surfaces separated by a distance, the transmission medium having an index of refraction, and
a sensor configured to measure an environmental parameter that influences a magnitude of one or both of the distance and the index of refraction,
the optical data is generated by the optical instrument in response to an optical signal traversing the optical path, and
the environmental data is generated by the sensor measuring the environmental parameter;
determining a predicted value of the optical property based on a model representing time evolution of the optical instrument; and
by operation of one or more processors, calculating an effective value of the optical property based on:
the measured value,
the predicted value, and
a Kalman gain based on respective uncertainties in the measured and predicted values, the Kalman gain defining a relative weighting of the measured and predicted values in the effective value.

2. The method of claim 1,
wherein the Kalman gain is biased towards the measured value when the uncertainty in the measured value is less than the uncertainty in the predicted value; and wherein the Kalman gain is biased towards the predicted value when the uncertainty in the predicted value is less than the uncertainty in the measured value.

3. The method of claim 1,
wherein the model comprises:
   state variables comprising a first state variable representing the optical property and a second state variable representing the environmental parameter, and
   a state vector comprising respective state values for the state variables;
wherein the time evolution occurs from a previous period to a current period; and
wherein the method comprises:
   determining the Kalman gain based on a measurement noise matrix, a process noise matrix, and a covariance matrix, wherein:
      the measurement noise matrix comprises values representing an uncertainty in the optical and environmental data,
      the process noise matrix comprises values representing an uncertainty in the model, and
      the covariance matrix comprises values representing an uncertainty in the state values.

4. The method of claim 3, comprising:
repeating, over multiple iterations of respective periods, the operations of determining the measured value, determining the predicted value, determining the Kalman gain, and calculating the effective value; and
wherein the values of the measurement noise matrix, the process noise matrix, the covariance matrix, or any combination thereof, are updated for each iteration.

5. The method of claim 1,
wherein the model comprises:
   state variables comprising a first state variable representing the optical property and a second state variable representing the environmental parameter,
   a state vector comprising respective state values for the state variables, and
   a state evolution function defining a change in the state values from a first set of state values associated with a previous period to a second set of state values associated with a current period; and
wherein the time evolution occurs from the previous period to the current period; and
wherein determining the predicted value comprises:
   applying the state evolution function to the first set of state values to generate the second set of state values, a value of the second set of state values for the first state variable being the predicted value.

6. The method of claim 5, wherein the state evolution function comprises a plurality of sigma points and respective weighting factors.

7. The method of claim 5,
wherein determining the measured value comprises:
   obtaining measurement values for respective measurement variables of a measurement vector, wherein:
      the measurement variables comprise a first measurement variable representing the optical property and a second measurement variable representing the environmental parameter, and
      the measurement value obtained for the first measurement variable is the measured value; and
wherein calculating the effective value comprises:
   calculating residual values of a residual vector based on a difference between the measurement values and the second set of state values, and
   determining a third set of state values for the state vector based on the second set of state values, the Kalman gain, and the residual values, the third set of state values comprising the effective value.

8. The method of claim 7,
wherein the measurement variables define a measurement domain for the measurement vector and the state variables define a state domain for the state vector; and
wherein calculating the residual values comprises:
   applying a measurement function to the second set of state values to generate a converted second set of state values, the measurement function defining a change in the state values upon conversion from the state domain to the measurement domain; and
   subtracting the converted second set of state values from the measurement values to calculate the residual values of the residual vector.

9. The method of claim 1, wherein the environmental parameter comprises a temperature of the transmission medium, a pressure of the transmission medium, a humidity of the transmission medium, or a concentration of carbon dioxide in the transmission medium.

10. The method of claim 1, wherein the environmental parameter comprises a temperature of the transmission medium or a length of a spacer separating the two reflective surfaces.

11. A system comprising:
an optical instrument, configured to measure an optical property and comprising:
   an optical path having two reflective surfaces and a transmission medium therebetween, the two reflective surfaces separated by a distance, the transmission medium having an index of refraction, and
   a sensor configured to measure an environmental parameter that influences a magnitude of one or both of the distance and the index of refraction;
a control system comprising one or more processors and memory storing instructions that are configured to perform operations when executed by the one or more processors, the operations comprising:
   determining, based on optical data and environmental data, a measured value of the optical property, wherein:
      the optical data is generated by the optical instrument in response to an optical signal traversing the optical path, and
      the environmental data is generated by the sensor measuring the environmental parameter;
   determining a predicted value of the optical property based on a model representing time evolution of the optical instrument; and
   calculating an effective value of the optical property based on:
      the measured value,
      the predicted value, and
      a Kalman gain based on respective uncertainties in the measured and predicted values, the Kalman gain defining a relative weighting of the measured and predicted values in the effective value.

12. The system of claim 11,
wherein the Kalman gain is biased towards the measured value when the uncertainty in the measured value is less than the uncertainty in the predicted value; and
wherein the Kalman gain is biased towards the predicted value when the uncertainty in the predicted value is less than the uncertainty in the measured value.

13. The system of claim 11,
wherein the model comprises:
state variables comprising a first state variable representing the optical property and a second state variable representing the environmental parameter, and
a state vector comprising respective state values for the state variables;
wherein the time evolution occurs from a previous period to a current period; and
wherein the operations comprise:
determining the Kalman gain based on a measurement noise matrix, a process noise matrix, and a covariance matrix, wherein:
the measurement noise matrix comprises values representing an uncertainty in the optical and environmental data,
the process noise matrix comprises values representing an uncertainty in the model, and
the covariance matrix comprises values representing an uncertainty in the state values.

14. The system of claim 13, wherein the operations comprise:
repeating, over multiple iterations of respective periods, the operations of determining the measured value, determining the predicted value, determining the Kalman gain, and calculating the effective value; and
wherein the values of the measurement noise matrix, the process noise matrix, the covariance matrix, or any combination thereof, are updated for each iteration.

15. The system of claim 11,
wherein the model comprises:
state variables comprising a first state variable representing the optical property and a second state variable representing the environmental parameter,
a state vector comprising respective state values for the state variables, and
a state evolution function defining a change in the state values from a first set of state values associated with a previous period to a second set of state values associated with a current period; and
wherein the time evolution occurs from the previous period to the current period; and
wherein determining the predicted value comprises:
applying the state evolution function to the first set of state values to generate the second set of state values, a value of the second set of state values for the first state variable being the predicted value.

16. The system of claim 15, wherein the state evolution function comprises a plurality of sigma points and respective weighting factors.

17. The system of claim 15,
wherein determining the measured value comprises:
obtaining measurement values for respective measurement variables of a measurement vector, wherein:
the measurement variables comprise a first measurement variable representing the optical property and a second measurement variable representing the environmental parameter, and
the measurement value obtained for the first measurement variable is the measured value; and
wherein calculating the effective value comprises:
calculating residual values of a residual vector based on a difference between the measurement values and the second set of state values, and
determining a third set of state values for the state vector based on the second set of state values, the Kalman gain, and the residual values, the third set of state values comprising the effective value.

18. The system of claim 17,
wherein the measurement variables define a measurement domain for the measurement vector and the state variables define a state domain for the state vector; and
wherein calculating the residual values comprises:
applying a measurement function to the second set of state values to generate a converted second set of state values, the measurement function defining a change in the state values upon conversion from the state domain to the measurement domain; and
subtracting the converted second set of state values from the measurement values to calculate the residual values of the residual vector.

19. The system of claim 11, wherein the environmental parameter comprises a temperature of the transmission medium, a pressure of the transmission medium, a humidity of the transmission medium, or a concentration of carbon dioxide in the transmission medium.

20. The system of claim 11, wherein the environmental parameter comprises a temperature of the transmission medium or a length of a spacer separating the two reflective surfaces.

21. A non-transitory computer-readable medium comprising instructions that are operable, when executed by one or more processors, to perform operations comprising:
determining, based on optical data and environmental data, a measured value of an optical property measured by an optical instrument, wherein:
the optical instrument comprises:
an optical path having two reflective surfaces and a transmission medium therebetween, and
a sensor configured to measure an environmental parameter of the transmission medium between the two reflective surfaces,
the optical data is generated by the optical instrument in response to an optical signal traversing the optical path, and
the environmental data is generated by the sensor measuring the environmental parameter;
determining a predicted value of the optical property based on a model representing time evolution of the optical instrument; and
calculating an effective value of the optical property based on:
the measured value,
the predicted value, and
a Kalman gain based on respective uncertainties in the measured and predicted values, the Kalman gain defining a relative weighting of the measured and predicted values in the effective value.

22. The non-transitory computer-readable medium of claim 21,
wherein the Kalman gain is biased towards the measured value when the uncertainty in the measured value is less than the uncertainty in the predicted value; and
wherein the Kalman gain is biased towards the predicted value when the uncertainty in the predicted value is less than the uncertainty in the measured value.

23. The non-transitory computer-readable medium of claim 21,
wherein the model comprises:
state variables comprising a first state variable representing the optical property and a second state variable representing the environmental parameter, and a state vector comprising respective state values for the state variables;

wherein the time evolution occurs from a previous period to a current period; and wherein the operations comprise:

determining the Kalman gain based on a measurement noise matrix, a process noise matrix, and a covariance matrix, wherein:

the measurement noise matrix comprises values representing an uncertainty in the optical and environmental data, the process noise matrix comprises values representing an uncertainty in the model, and the covariance matrix comprises values representing an uncertainty in the state values.

24. The non-transitory computer-readable medium of claim 23, wherein the operations comprise:

repeating, over multiple iterations of respective periods, the operations of determining the measured value, determining the predicted value, determining the Kalman gain, and calculating the effective value; and wherein the values of the measurement noise matrix, the process noise matrix, the covariance matrix, or any combination thereof, are updated for each iteration.

25. The non-transitory computer-readable medium of claim 21, wherein the model comprises:

state variables comprising a first state variable representing the optical property and a second state variable representing the environmental parameter, a state vector comprising respective state values for the state variables, and a state evolution function defining a change in the state values from a first set of state values associated with a previous period to a second set of state values associated with a current period; and wherein the time evolution occurs from the previous period to the current period; and wherein determining the predicted value comprises:

applying the state evolution function to the first set of state values to generate the second set of state values, a value of the second set of state values for the first state variable being the predicted value.

26. The non-transitory computer-readable medium of claim 25, wherein the state evolution function comprises a plurality of sigma points and respective weighting factors.

27. The non-transitory computer-readable medium of claim 25, wherein determining the measured value comprises:

obtaining measurement values for respective measurement variables of a measurement vector, wherein:

the measurement variables comprise a first measurement variable representing the optical property and a second measurement variable representing the environmental parameter, and the measurement value obtained for the first measurement variable is the measured value; and wherein calculating the effective value comprises:

calculating residual values of a residual vector based on a difference between the measurement values and the second set of state values, and determining a third set of state values for the state vector based on the second set of state values, the Kalman gain, and the residual values, the third set of state values comprising the effective value.

28. The non-transitory computer-readable medium of claim 27, wherein the measurement variables define a measurement domain for the measurement vector and the state variables define a state domain for the state vector; and wherein calculating the residual values comprises:

applying a measurement function to the second set of state values to generate a converted second set of state values, the measurement function defining a change in the state values upon conversion from the state domain to the measurement domain; and subtracting the converted second set of state values from the measurement values to calculate the residual values of the residual vector.

29. The non-transitory computer-readable medium of claim 21, wherein the environmental parameter comprises a temperature of the transmission medium, a pressure of the transmission medium, a humidity of the transmission medium, or a concentration of carbon dioxide in the transmission medium.

30. The non-transitory computer-readable medium of claim 21, wherein the environmental parameter comprises a temperature of the transmission medium or a length of a spacer separating the two reflective surfaces.

* * * * *

UNITED STATES PATENT AND TRADEMARK OFFICE
CERTIFICATE OF CORRECTION

| | |
|---|---|
| PATENT NO. | : 11,435,234 B1 |
| APPLICATION NO. | : 17/474946 |
| DATED | : September 6, 2022 |
| INVENTOR(S) | : Keaveney et al. |

It is certified that error appears in the above-identified patent and that said Letters Patent is hereby corrected as shown below:

On the Title Page

Column 1, Line 1, after "2021", insert -- ¶(65) Prior Publication Data US 2022/0260428 A1 Aug. 18, 2022 -- therefor.

In the Specification

Column 8, Line 58, delete "$x_i\pm\pm x_j$" and insert -- $x_i \pm \Delta x_j$ -- therefor.

Column 9, Line 67, delete "$\mathcal{R}_i\;;$" and insert -- $\mathcal{R}_i,$ -- therefor.

Column 10, Line 2, delete "$\mathcal{R}_i\;;$" and insert -- $\mathcal{R}_i,$ -- therefor.

Column 11, Line 27, delete "($a_1$)" and insert -- ($\sigma_i$) -- therefor.

Column 12, Line 22, Equation (21), delete "$\mu_z = \Sigma_i w_i(m) \mathcal{Z}_i$" and insert -- $\mu_z = \sum_i w_i^{(m)} \mathcal{Z}_i$ -- therefor.

Column 12, Line 23, Equation (22), delete "$\mathcal{P}_z = \Sigma_i w_i^{(c)}(\mathcal{Z}_i - \mu_z)^T + \mathcal{R},$" and insert -- $\mathcal{P}_z = \sum_i w_i^{(c)}(\mathcal{Z}_i - \mu_z)(\mathcal{Z}_i - \mu_z)^T + \mathcal{R}$ -- therefor.

Column 14, Line 20, after "matrix.", delete "¶".

Signed and Sealed this
Fifteenth Day of November, 2022

*Katherine Kelly Vidal*
*Director of the United States Patent and Trademark Office*

CERTIFICATE OF CORRECTION (continued)
U.S. Pat. No. 11,435,234 B1

Column 21, Line 30, delete "FIG. SA," and insert -- FIG. 5A, -- therefor.

Column 24, Line 32, delete "324" and insert -- 624 -- therefor.

Column 30, Line 48, delete "ay" and insert -- a y -- therefor.

Column 34, Line 45, after "example 2,", insert -- ¶ --.